US 12,418,314 B1

(12) United States Patent
Abdi et al.

(10) Patent No.: US 12,418,314 B1
(45) Date of Patent: Sep. 16, 2025

(54) SYSTEMS AND METHODS OF EXCHANGING DATA USING A HIGH-SPEED COMMUNICATION LINK

(71) Applicant: QUALCOMM Incorporated, San Diego, CA (US)

(72) Inventors: Afshin Abdi, San Diego, CA (US); Goran Goran, San Diego, CA (US); Xiaochen Guo, Los Angeles, CA (US); Engin Ipek, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 22 days.

(21) Appl. No.: 18/603,709

(22) Filed: Mar. 13, 2024

(51) Int. Cl.
*H03M 13/33* (2006.01)

(52) U.S. Cl.
CPC ......... *H03M 13/333* (2013.01); *H03M 13/33* (2013.01)

(58) Field of Classification Search
CPC .......................... H03M 13/333; H03M 13/33
See application file for complete search history.

(56) References Cited

U.S. PATENT DOCUMENTS

| | | | | |
|---|---|---|---|---|
| 5,084,891 A * | 1/1992 | Ariyavisitakul | ...... | H04W 88/08 714/775 |
| 6,018,304 A * | 1/2000 | Bessios | ................... | H03M 7/46 341/59 |
| 6,081,210 A * | 6/2000 | Nikolic | ................. | H03M 13/05 341/59 |
| 6,279,114 B1 * | 8/2001 | Toombs | ............... | G11C 16/102 711/E12.1 |
| 2002/0031185 A1 * | 3/2002 | Webb | ..................... | H04N 19/91 375/E7.279 |
| 2004/0059980 A1 * | 3/2004 | Bliss | ..................... | H03M 13/31 714/752 |
| 2005/0134451 A1 * | 6/2005 | Nikkola | ................. | A61B 5/681 340/539.11 |
| 2006/0247847 A1 * | 11/2006 | Carter | ...................... | B60T 7/18 701/498 |
| 2020/0295870 A1 * | 9/2020 | Jing | .................. | H04Q 11/0067 |

OTHER PUBLICATIONS

Moision B.E., et al., "On Codes that Avoid Specified Differences", IEEE, Transactions on Information Theory, vol. 47, No. 1, Jan. 2001, pp. 433-442.

\* cited by examiner

*Primary Examiner* — Joseph D Torres
(74) *Attorney, Agent, or Firm* — Moore IP

(57) ABSTRACT

A system includes a communication link coupled to an encoder and a decoder. The communication link includes a set of wires. The encoder is configured to encode a first block of input data to form a first codeword and to encode a second block of the input data to form a second codeword. The encoder is configured to generate a boundary bit based on at least one bit from each of the first codeword and the second codeword, and to send encoded data via the communication link. The encoded data includes a first set of bit values of the first codeword, a second set of bit values of the second codeword, and the boundary bit, which is located between the first set of bit values and the second set of bit values. The decoder is configured to decode the encoded data to generate a representation of the input data.

25 Claims, 10 Drawing Sheets

SYSTEMS AND METHODS OF EXCHANGING DATA USING A HIGH-SPEED COMMUNICATION LINK

I. FIELD

The present disclosure is generally related to exchanging data using a high-speed communication link.

II. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Such computing devices often incorporate functionality to exchange data between different components using a communication link. For example, a communication link can be used as a shared communication pathway to exchange data between a processor, a memory, and one or more peripherals. The communication link, such as a bus, consists of multiple wires that carry signals and are closely spaced within an available chip area. Cross-talk occurs when signals on one wire unintentionally affect signals on adjacent wires. For example, when a signal transitions voltages from low to high or high to low, the transitioning signal generates an electromagnetic field that can induce a voltage in nearby wires, potentially altering the signal's voltage level and resulting in an incorrect data transfer. However, separating wires of the communication link or sequencing communications at different times can increase chip area or decrease throughput.

III. SUMMARY

According to one implementation of the present disclosure, a system includes a communication link, an encoder coupled to the communication link, and a decoder coupled to the communication link. The communication link includes a set of wires. The encoder is configured to encode a first block of input data to form a first codeword and to encode a second block of the input data to form a second codeword. The encoder is also configured to generate a boundary bit based on at least one bit from each of the first codeword and the second codeword and to send encoded data via the communication link. The encoded data includes a first set of bit values of the first codeword, a second set of bit values of the second codeword, and the boundary bit. The boundary bit is located between the first set of bit values and the second set of bit values in the encoded data. The decoder is configured to decode the encoded data to generate a representation of the input data.

According to one implementation of the present disclosure, a method includes encoding, at a transmitter of a device, a first block of input data to form a first codeword. The method also includes encoding, at the transmitter, a second block of the input data to form a second codeword. The method includes generating, at the transmitter, a boundary bit based on at least one bit from each of the first codeword and the second codeword. The method further includes sending, from the transmitter, encoded data via a communication link that includes a set of wires. The encoded data includes a first set of bit values of the first codeword, a second set of bit values of the second codeword, and the boundary bit. The boundary bit is located between the first set of bit values and the second set of bit values in the encoded data.

According to one implementation of the present disclosure, a non-transitory computer-readable storage medium stores instructions that, when executed by at least one processor, cause the at least one processor to encode, at a transmitter of a device, a first block of input data to form a first codeword. The instructions also cause the at least one processor to encode, at the transmitter, a second block of the input data to form a second codeword. The instructions further cause the at least one processor to generate, at the transmitter, a boundary bit based on at least one bit from each of the first codeword and the second codeword. The instructions also cause the at least one processor to send, from the transmitter, encoded data via a communication link that includes a set of wires. The encoded data includes a first set of bit values of the first codeword, a second set of bit values of the second codeword, and the boundary bit. The boundary bit is located between the first set of bit values and the second set of bit values in the encoded data.

According to one implementation of the present disclosure, a device includes an encoder coupled to a communication link that includes a set of wires. The encoder is configured to encode a first block of input data to form a first codeword and to encode a second block of the input data to form a second codeword. The encoder is also configured to generate a boundary bit based on at least one bit from each of the first codeword and the second codeword, and to send encoded data via the communication link. The encoded data includes a first set of bit values of the first codeword, a second set of bit values of the second codeword, and the boundary bit. The boundary bit is located between the first set of bit values and the second set of bit values in the encoded data. According to one implementation of the present disclosure, an apparatus includes means for encoding a first block of input data to form a first codeword. The apparatus also includes means for encoding a second block of the input data to form a second codeword. The apparatus includes means for generating a boundary bit based on at least one bit from each of the first codeword and the second codeword. The apparatus further includes means for sending encoded data via a communication link that includes a set of wires. The encoded data includes a first set of bit values of the first codeword, a second set of bit values of the second codeword, and the boundary bit. The boundary bit is located between the first set of bit values and the second set of bit values in the encoded data.

According to one implementation of the present disclosure, a method includes receiving, at a receiver of a device, encoded data via a communication link that includes a set of wires. The encoded data includes at least a first set of bit values, a second set of bit values, and a boundary bit located between the first set of bit values and the second set of bit values. The method also includes generating, at the receiver, a first codeword based on the first set of bit values and a first subset of additional bit values. The additional bit values are based on the boundary bit, at least some of the first set of bit values, and at least some of the second set of bit values. The method includes generating, at the receiver, a second codeword based on the second set of bit values and a second subset of the additional bit values. The method further includes decoding, at the receiver, at least the first codeword and the second codeword to generate a representation of input data associated with the encoded data.

According to one implementation of the present disclosure, a non-transitory computer-readable storage medium stores instructions that, when executed by at least one processor, cause the at least one processor to receive, at a receiver of a device, encoded data via a communication link that includes a set of wires. The encoded data includes at least a first set of bit values, a second set of bit values, and a boundary bit located between the first set of bit values and the second set of bit values. The instructions also cause the at least one processor to generate, at the receiver, a first codeword based on the first set of bit values and a first subset of additional bit values. The additional bit values are based on the boundary bit, at least some of the first set of bit values, and at least some of the second set of bit values. The instructions cause the at least one processor to generate, at the receiver, a second codeword based on the second set of bit values and a second subset of the additional bit values. The instructions further cause the at least one processor to decode, at the receiver, at least the first codeword and the second codeword to generate a representation of input data associated with the encoded data.

According to one implementation of the present disclosure, a device includes a decoder coupled to a communication link that includes a set of wires. The decoder is configured to receive encoded data via the communication link. The encoded data includes at least a first set of bit values, a second set of bit values, and a boundary bit located between the first set of bit values and the second set of bit values. The decoder is also configured to generate a first codeword based on the first set of bit values and a first subset of additional bit values. The additional bit values are based on the boundary bit, at least some of the first set of bit values, and at least some of the second set of bit values. The decoder is configured to generate a second codeword based on the second set of bit values and a second subset of the additional bit values. The decoder is further configured to decode at least the first codeword and the second codeword to generate a representation of input data associated with the encoded data.

According to one implementation of the present disclosure, an apparatus includes means for receiving encoded data via a communications link that includes a set of wires. The encoded data includes at least a first set of bit values, a second set of bit values, and a boundary bit located between the first set of bit values and the second set of bit values. The apparatus also includes means for generating a first codeword based on the first set of bit values and a first subset of additional bit values. The additional bit values are based on the boundary bit, at least some of the first set of bit values, and at least some of the second set of bit values. The apparatus includes means for generating a second codeword based on the second set of bit values and a second subset of the additional bit values. The apparatus further includes means for decoding at least the first codeword and the second codeword to generate a representation of input data associated with the encoded data.

Other aspects, advantages, and features of the present disclosure will become apparent after review of the entire application, including the following sections: Brief Description of the Drawings, Detailed Description, and the Claims.

IV. Brief Description of the Drawings

V. DETAILED DESCRIPTION

Figure 1:
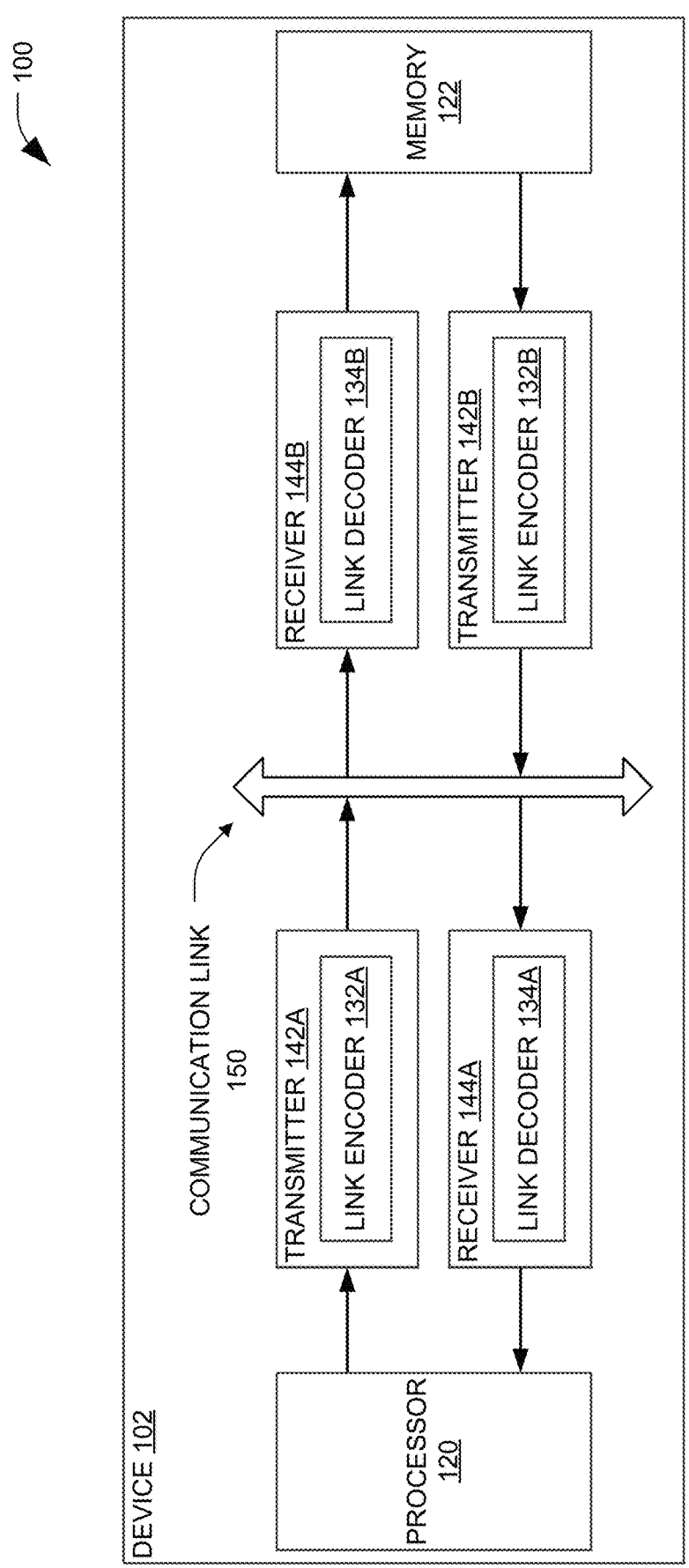
FIG. 1 is a block diagram of a particular illustrative aspect of a system operable to exchange data using a high-speed communication link, in accordance with some examples of the present disclosure.

One source of incorrect data transfers in typical communication links is cross-talk, which occurs when signals on one wire unintentionally affect signals on adjacent wires. For example, when a signal transitions voltage levels from low to high or high to low, the transitioning signal generates an electromagnetic field that can induce a voltage in nearby wires, potentially altering the signal's voltage level and resulting in an incorrect data transfer. One technique for reducing cross-talk is to include a shield wire between each wire that carries data (e.g., a data wire), such that a data wire is protected from the electromagnetic field of a nearby data wire by a shield wire interspersed between the data wires to block the electromagnetic field. However, separating wires of the communication link by shields can increase chip area or decrease throughput.

Systems and methods of exchanging data using a high-speed communication link are disclosed. For example, input data is to be sent from a first component (e.g., a processor) of a device via a communication link to a second component (e.g., memory) of the device. The communication link may consist of multiple wires that carry signals and are closely spaced. For example, the communication link can include an on-chip bus consisting of multiple wires that are closely spaced within an available chip area. Prior to sending the input data, an encoder included in a transmitter may partition the input data into blocks that are encoded to generate codewords such that sending the codewords on the wires of the communication is not likely to cause cross-talk. To illustrate, the encoder may partition the input data into two or more blocks and generate a codeword for each block. For example, the codewords are generated such that adjacent bits do not transition in opposite directions. However, multiple codewords can be sent on the set of wires concurrently and a least significant bit of a first codeword and a most significant bit of an adjacent codeword could transition in opposite directions. To prevent cross-talk between each adjacent pair of codewords, the encoder may generate a boundary bit and a flag bit based on at least one bit of each of the pair of codewords. For example, for a first codeword and a second codeword (e.g., a pair of codewords that correspond to consecutive blocks of data), the encoder may generate a boundary bit and a flag bit by accessing a mapping to map the two least significant bits of the first codeword and the two most significant bits of the second codeword to the boundary bit and the flag bit.

To generate the final encoded data that is to be sent via the communication link, the encoder may replace some bits of adjacent codewords with a corresponding boundary bit that is inserted between the modified codewords (e.g., partial codewords) and a flag bit that is appended after the modified codewords. For example, the encoded data may include a first set of bit values of the first codeword, a second set of bit values of the second codeword, a boundary bit located between the first set of bit values and the second set of bit values, and a flag bit located after the second set of bit values, after an optional shield bit. In this example, the first set of bit values includes all but the least significant bit of the first codeword (e.g., the first set of bit values excludes the last bit of the first codeword), and the second set of bit values includes all but the most significant bit of the second codeword (e.g., the second set of bit values excludes the first bit of the second codeword). To illustrate, the boundary bit replaces the least significant bit of the first codeword and the most significant bit of the second codeword, which are omitted in the encoded data. The flag bit, and any other flag bits, are located after the second set of bit values and any sets of bit values corresponding to other codewords. In some implementations, the flag bits may be separated from the last codeword of the multiple codewords by a shield bit. Additionally, or alternatively, the flag bits may be encoded, such as using the same encoding scheme as the blocks of the input data or another appropriate encoding scheme.

A decoder included in a receiver coupled to the communication link may receive the encoded data and identify the boundary bits and the flag bits in order to map these bits to additional bit values using an inverse mapping. The decoder may combine the additional bit values with sets of bit values from the encoded data to generate codewords. For example, the decoder may combine the first set of bit values of the encoded data and a first subset of the additional bit values to reproduce the first codeword. As another example, the decoder may combine the second set of bit values of the encoded data and a second subset of the additional bit values to reproduce the second codeword. The decoder may decode the codewords (e.g., the first codeword and the second codeword) to generate a representation of the input data.

At least some aspects of the present disclosure provide systems and methods that support exchanging data using a high-speed communication link in a manner that reduces cross-talk without nearly doubling the on-chip area used by the communication link. Encoding schemes are used to generate codewords such that cross-talk is eliminated within the codewords, along with boundary bits and flag bits to eliminate cross-talk between adjacent codewords. In some examples, the boundary bits and the flag bits replace some of the bit values of the codewords that are not included in the encoded data that is transmitted via the communication link. The boundary bits and the flag bits can thus be transmitted without using additional wires. A technical advantage of using the boundary bits and the flag bits to reduce cross-talk includes increasing the accuracy of data exchanged via a communication link that has a smaller footprint (e.g., that occupies less on-chip area) as compared to other communication links with large numbers of shield wires to reduce cross-talk.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. Further, some features described herein are singular in some implementations and plural in other implementations. For ease of reference herein, such features are generally introduced as "one or more" features and are subsequently referred to in the singular or optional plural (as indicated by "(s)") unless aspects related to multiple of the features are being described.

In some drawings, multiple instances of a particular type of feature are used. Although these features are physically and/or logically distinct, the same reference number is used for each, and the different instances are distinguished by addition of a letter to the reference number. When the features as a group or a type are referred to herein, e.g., when no particular one of the features is being referenced, the reference number is used without a distinguishing letter. However, when one particular feature of multiple features of the same type is referred to herein, the reference number is used with the distinguishing letter. For example, referring to FIG. 1, multiple transmitters are illustrated and associated with reference numbers 142A and 142B. When referring to a particular one of these transmitters, such as a transmitter 142A, the distinguishing letter "A" is used. However, when referring to any arbitrary one of these transmitters or to these transmitters as a group, the reference number 142 is used without a distinguishing letter.

As used herein, the terms "comprise," "comprises," and "comprising" may be used interchangeably with "include," "includes," or "including." Additionally, the term "wherein" may be used interchangeably with "where." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

As used herein, "coupled" may include "communicatively coupled," "electrically coupled," or "physically coupled," and may also (or alternatively) include any combinations thereof. Two devices (or components) may be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled may be included in the same device or in different devices and may be connected via electronics, one or more connectors, or inductive coupling, as illustrative, non-limiting examples. In some implementations, two devices (or components) that are communicatively coupled, such as in electrical communication, may send and receive signals (e.g., digital signals or analog signals) directly or indirectly, via one or more wires, buses, networks, etc. As used herein, "directly coupled" may include two devices that are coupled (e.g., communicatively coupled, electrically coupled, or physically coupled) without intervening components.

In the present disclosure, terms such as "determining," "calculating," "estimating," "shifting," "adjusting," etc. may be used to describe how one or more operations are performed. It should be noted that such terms are not to be construed as limiting and other techniques may be utilized to perform similar operations. Additionally, as referred to herein, "generating," "calculating," "estimating," "using," "selecting," "accessing," and "determining" may be used interchangeably. For example, "generating," "calculating," "estimating," or "determining" a parameter (or a signal) may refer to actively generating, estimating, calculating, or determining the parameter (or the signal) or may refer to using, selecting, or accessing the parameter (or signal) that is already generated, such as by another component or device.

Referring to FIG. 1, a particular illustrative aspect of a system configured to exchange data using a high-speed communication link is disclosed and generally designated 100. The system 100 includes a device 102 that includes a plurality of components that are configured to exchange data using a communication link 150.

In a particular implementation, the device 102 includes a processor 120 that is coupled via the communication link 150 to a memory 122. The device 102 also includes a plurality of transmitters 142 and a plurality of receivers 144 that are each coupled to the communication link 150. For example, the device 102 includes a transmitter 142A and a receiver 144A that are each coupled to the processor 120 and to the communication link 150. The transmitter 142A is configured to obtain data from the processor 120 for transmission via the communication link 150 to one or more components of the device 102, such as the memory 122. The receiver 144A is configured to receive data from one or more components of the device 102 via the communication link 150 to provide to the processor 120. As another example, the device 102 includes a transmitter 142B and a receiver 144B that are each coupled to the memory 122 and to the communication link 150. The transmitter 142B is configured to obtain data from the memory 122 for transmission via the communication link 150 to one or more components of the device 102, such as the processor 120. The receiver 144B is configured to receive data from one or more components of the device 102 via the communication link 150 to provide to the memory 122.

The processor 120 may be configured to control or perform the operations described herein with reference to the device 102. The processor 120 may include one or more microcontrollers, application specific integrated circuits (ASICs), field programmable gate arrays (FPGAs), central processing units (CPUs) having one or more processing cores, processing systems, or other circuitry and logic configured to facilitate the operations of the device 102. In some implementations, the processor 120 is coupled to another memory or a non-transitory, computer-readable storage medium that stores instructions that, when executed by the processor 120, cause performance of the operations described herein. The memory 122 may include one or more hard disk drives (HDDs), one or more solid state drives (SSDs), flash memory devices, network accessible storage (NAS) devices, or other memory devices configured to store data in a persistent or non-persistent state. In some implementations, the memory 122 stores data generated by the processor 120 during operation of the device 102, data that enables performance of one or more of the operations described herein, other data, or a combination thereof.

In some implementations, the communication link 150 includes a plurality of wires, at least some of which are configured to communicate corresponding bit values of data, or additional bit values of other information, to facilitate the communication of encoded data between components of the device 102 via the communication link 150, such as the processor 120 and the memory 122. For example, a wire of the communication link 150 may be configured to carry a voltage that indicates a data bit, an encoded data bit, a boundary bit, a flag bit, or another type of bit, as further described herein. Such wires may be referred to as data wires, boundary wires, and flag wires, respectively. Additionally, or alternatively, the communication link 150 may include one or more shield wires that are configured to protect adjacent wires from electromagnetic fields generated by wires on the other side of the shield wires. A shield wire may be placed between two wires of the communication link 150 that are designated to communicate data, and the shield wire may be grounded to provide a shield or buffer to electromagnetic fields generated by cross-coupling capacitance between the data wires. In some implementations, the communication link 150 includes a bus, such as a high-speed data bus. In some examples, the communication link (e.g., the data bus) is configured to operate according to one or more communication protocols, such as a Peripheral Component Interconnect (PCI) protocol, a PCI Express (PCIe) protocol, or a Small Computer System Interface (SCSI) protocol, as non-limiting examples. Alternatively, the communication link 150 may be a link in a different type of point-to-point link or a link between multiple devices, such as a communication link between nodes of a torus network or a mesh network, as non-limiting examples.

It should be understood that the processor 120 and the memory 122 are provided as illustrative examples of components of the device 102 that use transmitters and receivers to exchange data via the communication link 150, in other examples the device 102 can include one or more additional components, one or more different components, or a combination thereof, that are configured to use transmitters and receivers to exchange data via the communication link 150. In yet other examples, multiple devices can use transmitters and receivers to exchange data with each other via a communication link 150. In some examples, nodes of a network can use transmitters and receivers to exchange data with each other via a communication link 150.

In the example shown in FIG. 1, a transmitter 142 includes a link encoder 132 and a receiver 144 includes a link decoder 134. For example, the transmitter 142A and the transmitter 142B include a link encoder 132A and a link encoder 132B, respectively, and the receiver 144A and the receiver 144B include a link decoder 134A and a link decoder 134B, respectively.

The transmitter 142 is configured to obtain encoded data (e.g., a set of bit values) to be sent via a set of wires of the communication link 150. The link encoder 132 is configured to partition input data into multiple blocks and to encode the blocks according to an encoding scheme to generate corresponding codewords. The encoding scheme may be configured to prevent occurrence of a cross-talk pattern in encoded codewords. The cross-talk pattern includes two adjacent bits transitioning in opposite directions during consecutive transmissions via the communication link 150. Additional details of encoding schemes designed to prevent occurrence of the cross-talk pattern are further described herein with reference to FIG. 4. The link encoder 132 is also configured to generate boundary bits and flag bits based on at least one bit from each of two consecutive codewords, and the link encoder 132 is configured to generate the encoded data that includes sets of bit values (but not an entirety) of each codeword as well as the boundary bits and the flag bits. Although described as including less than an entirety of corresponding codewords, in other implementations the sets of bit values may include an entirety of one or both consecutive codewords. The boundary bits may be located in the encoded data between sets of bit values corresponding to adjacent codewords, and the flag bits may be located in the encoded data after the last set of bit values that corresponds to the last codeword, as further described herein. By using an encoding scheme that prevents occurrence of the cross-talk pattern within the codewords and adding the boundary bits between portions of adjacent codewords to prevent occurrence of the cross-talk pattern between adjacent codewords, the link encoder 132 is configured to have a technical advantage of generating encoded data that is less likely to result in cross-talk and improve transmission accuracy. Optionally, in some implementations, using the flag bits in addition to the boundary bits enables omitting some bits of the codewords from the encoded data so that the boundary bits and the flag bits can be sent without using additional wires, as compared to sending the entirety of the first codeword and the second codeword. Thus, in some implementations, cross-talk can be reduced (e.g., prevented) without increasing the footprint of the communication link 150.

In a particular implementation, the link encoder 132 is configured to encode a first block of input data to form a first codeword and to encode a second block of input data to form a second codeword. In some examples, the link encoder 132 may access a lookup table to generate the codewords, or the link encoder 132 may include dedicated circuitry (e.g., logic gates) that are configured to encode blocks of data according to the encoding scheme. The size of the codewords may be larger than the size of the blocks of the input data, based on the encoding scheme being designed to prevent the cross-talk pattern from occurring in successive codewords. After generating the codewords, the link encoder 132 may generate a boundary bit based on at least one bit from each of the first codeword and the second codeword that are to be concurrently transmitted via adjacent subsets of wires of the communication link 150. For example, the link encoder 132 may generate the boundary bit based on a pair of least significant bits of the first codeword and a pair of most significant bits of the second codeword. The example of generating the boundary bit based on two bit values of each codeword is illustrative, and in other implementations, the boundary bit may be based on a first count of least significant bits (e.g., one or more bit values) of the first codeword and a second count of most significant bits (e.g., one or more bit values) of the second codeword. In such implementations, the first count may include fewer than two or more than two, the second count may include fewer than two or more than two, the first count may be the same as the second count, the first count may be different than the second count, or a combination thereof.

In some implementations, the link encoder 132 generates a flag bit based on the same bit values of the first codeword and the second codeword that are used to generate the boundary bit. For example, the link encoder 132 may access a predefined mapping (e.g., a lookup table) to map the at least one bit from each of the first codeword and the second codeword to the boundary bit and the flag bit. The predefined mapping may be designed to prevent occurrence of the cross-talk pattern in a sequence of codewords (e.g., in codewords of the encoded input data that are to be transmitted sequentially using the same subset of wires of the communication link 150). Although described as providing a mapping from bit values of adjacent codewords to one boundary bit and one flag bit, in other implementations, the predefined mapping may provide a mapping of any number of bit values from pairs of adjacent codewords to a third count of boundary bits and a fourth count of flag bits. In such implementations, the third count may include more than one, the fourth count may include more than one, the third count may be the same as the fourth count, the third count may be different that the fourth count, or a combination thereof.

The link encoder 132 may combine the boundary bit and the flag bit with portions of the first codeword and the second codeword to generate encoded data to be sent via the communication link 150, as further described with reference to FIGS. 2 and 5-7. For example, the encoded data may include a first set of bit values of the first codeword that omits at least one least significant bit of the first codeword, a second set of bit values of the second codeword that omits at least one most significant bit of the second codeword, the boundary bit located between the first set of bit values and the second set of bit values, and the flag bit located after the second set of bit values (and any other sets of bit values of any other codewords). Additional blocks of input data may be similarly encoded, and corresponding boundary and flag bits generated, such that the encoded data includes sets of bit values that omit one or more bit values of a corresponding codeword, separated by boundary bits, followed by multiple flag bits, and each bit of the encoded data may be communicated via a corresponding wire of the communication link 150. In some implementations, the encoded data includes a shield bit (e.g., the communication link 150 may include a shield wire) between the last set of bit values corresponding to a codeword and the flag bits, to prevent cross-talk from the flag bits from affecting the data bits. Additionally, or alternatively, the flag bits may be encoded according to an encoding scheme (e.g., the same encoding scheme) to prevent occurrence of the cross-talk pattern between adjacent flag bits.

A link decoder 134 is configured to decode encoded data received via the communication link 150 to generate a representation of the input data, as further described with reference to FIGS. 3 and 5. For example, the link decoder 134 may partition the encoded data into multiple sets of bit values that correspond to encoded codewords, boundary bits, and flag bits, and the link decoder 134 may determine additional bit values to combine with the sets of bit values based on the boundary bits and the flag bits. In this example, the link decoder 134 may access a predefined mapping, such as an inverse of the mapping used to generate the boundary bits and the flag bits, to map the identified boundary bits and flag bits to additional bit values that are omitted from the sets of bit values in the encoded data. The link decoder 134 may decode codewords formed from combining the sets of bit values with corresponding bit values of the additional bit values to generate representations of blocks of the input data, and the link decoder 134 may combine the representations of the blocks to generate the representation of the input data that is output by the receiver 144. To illustrate, the link decoder 134 may decode the generated codewords according to a decoding scheme that is associated with the encoding scheme used to encode the input data by the link encoder 132 and that prevents the occurrence of the cross-talk pattern within consecutively transmitted codewords. As a particular example, the link decoder 134 may identify, from encoded data received via the communication link 150, a first set of bit values, a second set of bit values, a boundary bit located between the first set of bit values and the second set of bit values, and a flag bit located after the second set of bit values, and the link decoder 134 may determine additional bit values based on the boundary bit and the flag bit (e.g., by accessing a predefined mapping). After determining the additional bit values, the link decoder 134 may generate a first codeword based on the first set of bit values and a first subset of the additional bit values, and the link decoder 134 may generate a second codeword based on the second set of bit values and a second subset of the additional bit values. The link decoder 134 may decode at least the first codeword and the second codeword, and combine the decoded blocks, to generate a representation of the input data received via the communication link 150.

The system 100 thus supports exchanging data using the communication link 150 in a manner that reduces or eliminates errors caused by cross-talk without nearly doubling the on-chip area used by the communication link 150. For example, the transmitter 142 and the receiver 144 (e.g., the link encoder 132 and the link decoder 134) utilize cross-talk eliminating encoding schemes and decoding schemes, along with boundary bits and flag bits that are communicated via particular wires of the communication link 150, to enable data exchange via the communication link 150 with reduced cross-talk and with the communication link 150 occupying less on-chip area than communication links that include shield wires between each data wire. Instead, the link encoder 132 maps bit values located nearest to boundaries between codewords to boundary bits and flag bits with the boundary bits specifically positioned in the encoded data to prevent cross-talk patterns from occurring between adjacent sets of bit values (e.g., partial codewords), and the codewords themselves are encoded to prevent the cross-talk patterns from occurring within the codewords. Therefore, the encoded data generated by the system 100 may be exchanged via the communication link 150 with reduced cross-talk. Additionally, the number of wires in the communication link 150 used to communicate the encoded data (including the boundary bits and the flag bits) are less than the number of data wires and shield wires in other types of communication links that reduce cross-talk by having a shield wire between each pair of data wires. Thus, the system 100 occupies a reduced on-chip area as compared to such other types of communication links, while also achieving cross-talk reduction benefits.

Figure 2:
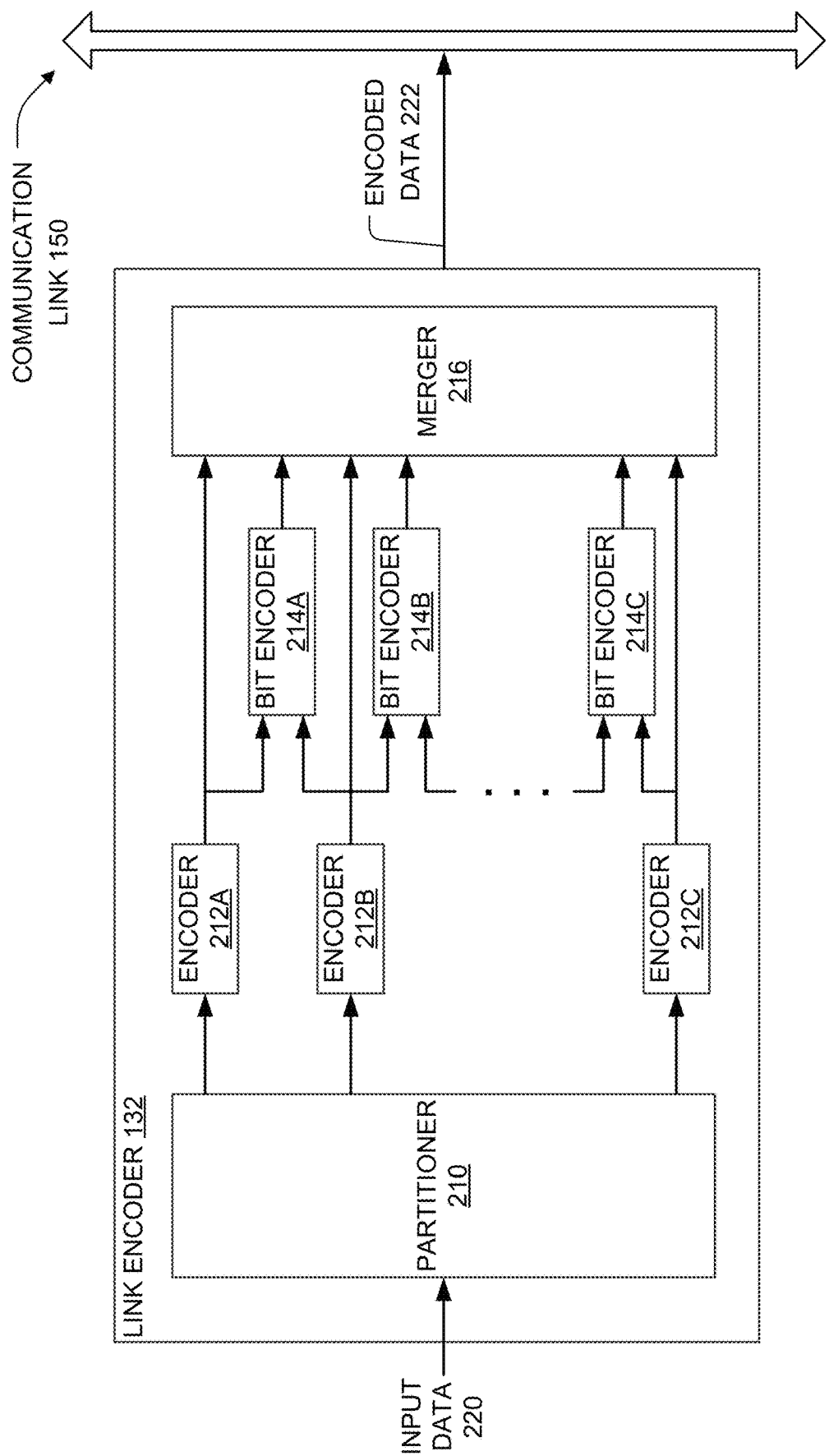
FIG. 2 is a block diagram of a particular illustrative aspect of a link encoder operable to encode data for exchange via a high-speed communication link, in accordance with some examples of the present disclosure.

FIG. 2 illustrates a particular illustrative aspect of the link encoder 132 configured to encode data for exchange via a high-speed communication link, in accordance with some examples of the present disclosure. The link encoder 132 includes a plurality of components that are configured to generate encoded data that is to be sent via the communication link 150.

In a particular implementation, the link encoder 132 includes a partitioner 210, one or more encoder(s) 212 coupled to the partitioner 210, one or more bit encoder(s) 214 coupled to the encoder(s) 212, and a merger 216 coupled to the bit encoder(s) 214. In some implementations, the encoder(s) 212 include multiple encoders that are each configured to encode a corresponding block of input data. For example, the encoder(s) 212 may include an encoder 212A, an encoder 212B, and an encoder 212C. Although three encoder(s) 212 are shown, in other implementations, the link encoder 132 may include fewer than three or more than three encoder(s) 212. Additionally, or alternatively, the bit encoder(s) 214 may include multiple bit encoders that are each configured to map a corresponding group of bit values to boundary bits and flag bits. For example, the bit encoder(s) 214 may include a bit encoder 214A, a bit encoder 214B, and a bit encoder 214C. Although three bit encoder(s) 214 are shown, in other implementations, the link encoder 132 may include fewer than three or more than three bit encoder(s) 214. Although shown in FIG. 2 as distinct encoders and bit encoders, in some other implementations, the encoders 212A-C correspond to different portions of a single encoder, the bit encoders 214A-C correspond to different portions of a single bit encoder, or both. Although the link encoder 132 is depicted in FIG. 2 as including the same number of encoder(s) 212 as bit encoder(s) 214, in other implementations, a count of the encoder(s) 212 is different than a count of the bit encoder(s) 214.

Although FIG. 2 illustrates particular components of the link encoder 132, it should be understood that, in other examples, the link encoder 132 can include one or more additional components, one or more different components, or a combination thereof, that are configured to generate encoded data to be transmitted via the communication link 150. Additionally, or alternatively, although illustrated and described as separate components, such illustration and description is for ease of explanation, and in other implementations, operations of one or more of the partitioner 210, the encoder(s) 212, the bit encoder(s) 214, and the merger 216 may be performed by the same component. In some implementations, the partitioner 210, the encoder(s) 212, the bit encoder(s) 214, the merger 216, or a combination thereof, may include or correspond to one or more processors, circuitry, or other hardware configured to perform the operations described herein, such as one or more ASICs, one or more FPGAs, other circuitry or logic, or a combination thereof.

The partitioner 210 is configured to partition input data (e.g., data to be transmitted via the communication link 150) into multiple blocks for encoding and further processing. The size of the blocks may be selected and preprogrammed based on the size of the input data, the complexity of the encoding scheme, the available processing resources of the link encoder 132, other considerations, or a combination thereof. Each block may be sized the same as the other blocks, or at least one block may have a different size than other blocks of the multiple blocks generated by the partitioner 210. As a particular example, the size of the input data may be 148 bits, the partitioner 210 may divide the input data into 15 blocks, and the size of 14 blocks may be 10 bits and the size of one block may be 8 bits, or the size of 13 blocks may be 10 bits and the size of two blocks may be 9 bits. In other examples, the partitioner 210 may be configured to partition the input data into more than 15 or fewer than 15 blocks, the blocks may have a size that is greater than 10 or less than 10 bits, or a combination thereof.

The encoder(s) 212 are configured to encode the blocks of input data received from the partitioner 210 to generate codewords (e.g., blocks of encoded data). For example, the encoder 212A may be configured to encode a first block of data to generate a first codeword, the encoder 212B may be configured to encode a second block of data to generate a second codeword, and the encoder 212C may be configured to generate an nth block of data to generate an nth codeword. Although three encoders are shown in FIG. 2, in other examples, n may be any number based on the considerations described above, such as fifteen, as a non-limiting example. The encoder(s) 212 are each configured to encode the corresponding block of input data according to an encoding scheme that is designed to prevent a cross-talk pattern from occurring in consecutive codewords that are to be transmitted via the same wires of the communication link 150. For example, the encoding scheme may be designed such that, for any possible codeword, no other possible codeword would cause the cross-talk pattern to occur if the two codewords are transmitted consecutively. As such, the size of the codewords may be larger than the size of the corresponding blocks of input data. Additional examples and details of such encoding schemes are described further herein with reference to FIG. 4.

The bit encoder(s) 214 are configured to map bit values of adjacent codewords generated by the encoder(s) 212 to generate boundary bits and flag bits. For example, the bit encoder 214A may be configured to generate a first boundary bit and a first flag bit based on at least one bit from each of the first codeword and the second codeword, the bit encoder 214B may be configured to generate a second boundary bit and a second flag bit based on at least one bit from each of the second codeword and a third codeword (not shown), and the bit encoder 214C may be configured to generate an (n−1)th boundary bit and an (n−1)th flag bit based on at least one bit from each of an (n−1)th codeword and the nth codeword. Although three bit encoder(s) 214 are shown in FIG. 2, in other examples, there may be fewer than three or more than three bit encoder(s) 214. Additionally, although an example of mapping two bit values (e.g., a bit value from each of two codewords) to one boundary bit and one flag bit, this is provided as an illustrative example. In other examples, one or more bit values (e.g., one or more bit values from each of two adjacent codewords) may be mapped to one or more boundary bits and one or more flag bits.

The bit encoder(s) 214 are each configured to determine the corresponding boundary bit and flag bit according to a predefined mapping that is designed to prevent a cross-talk pattern from occurring in groupings of bit values from consecutive pairs of adjacent codewords that are to be transmitted via the same wires of the communication link 150. For example, the predefined mapping may be designed such that, for any possible grouping of a boundary bit and bit values from each of two adjacent codewords, no other possible combination of a boundary bit and bit values of two adjacent codewords would cause the cross-talk pattern to occur if the two combinations of boundary bit and bit values of adjacent codewords are transmitted consecutively. In some implementations, the bit encoder(s) 214 include or correspond to a lookup table that is accessed to map bit values of codewords to boundary bits and flag bits.

Alternatively, the bit encoder(s) 214 include or correspond to dedicated circuitry, such as logic gates, that are configured to perform the mapping of bit values of codewords to boundary bits and flag bits according to the predefined mapping. Additional examples and details of such predefined mappings are described further herein with reference to FIG. 4.

The merger 216 is configured to combine (e.g., merge) the codewords generated by the encoder(s) 212 and the boundary bits and flag bits generated by the bit encoder(s) 214 to generate the encoded data that is to be transmitted via the communication link 150. To merge the codewords, the boundary bits, and the flag bits, the merger 216 may be configured to insert the boundary bits and the flag bits at particular locations with relation to bit values of the codewords, and to omit at least one bit of each of the codewords. For example, at least one bit of each of a pair of adjacent codewords may be replaced with a corresponding boundary bit, and the flag bits may be appended to the end of the bit values of the last codeword, such that in the encoded data generated by the merger 216, each boundary bit is located between sets of bit values corresponding to adjacent codewords, and the flag bits are located after the last set of bit values that corresponds to the last codeword.

During operation of the link encoder 132, the partitioner 210 may receive input data 220 and partition the input data 220 into multiple blocks of data. The multiple blocks may include a first block, a second block, a third block, an (n−1)th block, and an nth block. The encoder(s) 212 may encode the blocks according to an encoding scheme to generate multiple codewords. For example, the encoder 212A may encode the first block to generate a first codeword, the encoder 212B may encode the second block to generate a second codeword, a third of the encoder(s) 212 may encode the third block to generate a third codeword, an (n−1)th of the encoder(s) 212 may encode the (n−1)th block to generate an (n−1)th codeword, and the encoder 212C may encode the nth block to generate the nth codeword. The bit encoder(s) 214 may generate boundary bits and flag bits based on at least some bit values of the multiple codewords. To generate the boundary bits and the flag bits, the bit encoder(s) 214 may access a predefined mapping to map at least some bit values of the codewords to corresponding boundary bits and flag bits. For example, the bit encoder 214A may generate a first boundary bit and a first flag bit based on at least one bit from each of the first codeword and the second codeword, the bit encoder 214B may generate a second boundary bit and a second flag bit based on at least one bit from each of the second codeword and the third codeword, and the bit encoder 214C may generate an (n−1)th boundary bit and an (n−1)th flag bit based on at least one bit from each of the (n−1)th codeword and the nth codeword.

The merger 216 may merge the codewords, the boundary bits, and the flag bits to generate encoded data 222. To perform the merging, the merger 216 may select sets of bit values (e.g., less than an entirety) of each of the codewords to combine with the boundary bits and the flag bits, such that the merger 216 inserts the boundary bits and appends the flag bits in particular locations with respect to the other bit values, to generate the encoded data 222. For example, in the encoded data 222, the first boundary bit may be located between a first set of bit values that corresponds to the first codeword and a second set of bit values that corresponds to the second codeword, the second boundary bit may be located between the second set of bit values and a third set of bit values that corresponds to the third codeword, the (n−1)th boundary bit may be located between an (n−1)th set of bit values that corresponds to the (n−1)th codeword and an nth set of bit values that corresponds to the nth codeword, and the flag bits may be located, in an ordered sequence, after the nth set of bit values. Each set of bit values may omit a least significant bit of one codeword and a most significant bit of the other codeword, such that a corresponding boundary bit replaces these bit values in the encoded data 222. As an example, the first set of bit values may omit the least significant bit of the first codeword and the second set of bit values may omit the most significant bit of the second codeword. In some implementations, the merger 216 inserts a shield bit between the last set of bit values and the flag bits. An example of generating encoded data that includes boundary bits and flag bits is further described herein with reference to FIG. 6. In some implementations, the flag bits are encoded, such as according to the same encoding scheme as the input data. An example of generating encoded data that includes boundary bits and encoded flag bits is further described herein with reference to FIG. 7.

The encoded data 222 may be sent by the link encoder 132 (e.g., the transmitter 142) via the communication link 150. Because the encoded data 222 includes sets of bit values (e.g., partial codewords), boundary bits, flag bits, and an optional shield bit, the size of the encoded data 222 is larger than the input data 220, and therefore the communication link 150 includes more wires than the number of bits of the input data 220. However, using a relatively simple encoding scheme (as further described herein with reference to FIG. 4), the total number of wires included in the communication link 150 and configured to communicate the encoded data bit values, the boundary bits, and the flag bits is less than the total number of wires in a communication link that includes a shield wire between each data wire. In a particular implementation in which the size of the input data 220 is 148 bits and is partitioned into 15 blocks of 10, 9, or 8 bits each, the total number of wires included in the communication link 150 to support encoding according to the encoding schemes of FIG. 4 and with one boundary bit and one flag bit for each pair of adjacent codewords is 223 wires, as compared to a communication link that includes a shield bit between each data wire and thus includes 295 wires. In other implementations, the input data 220 may have other data sizes, the input data 220 may be partitioned into blocks that have more than 10 or fewer than 10 bits, the encoding scheme may result in differently sized codewords, and the total number of wires included in the communication link 150 may be more than or fewer than 223 wires.

Accordingly, the link encoder 132 of FIG. 2 enables exchange of data with reduced cross-talk, and thus improved accuracy, using the communication link 150 that occupies a reduced on-chip area as compared to other communication links that reduce cross-talk (e.g., for example, by reducing the total number of wires in the communication link by approximately 72 wires, as compared to the other communication links).

Figure 3:
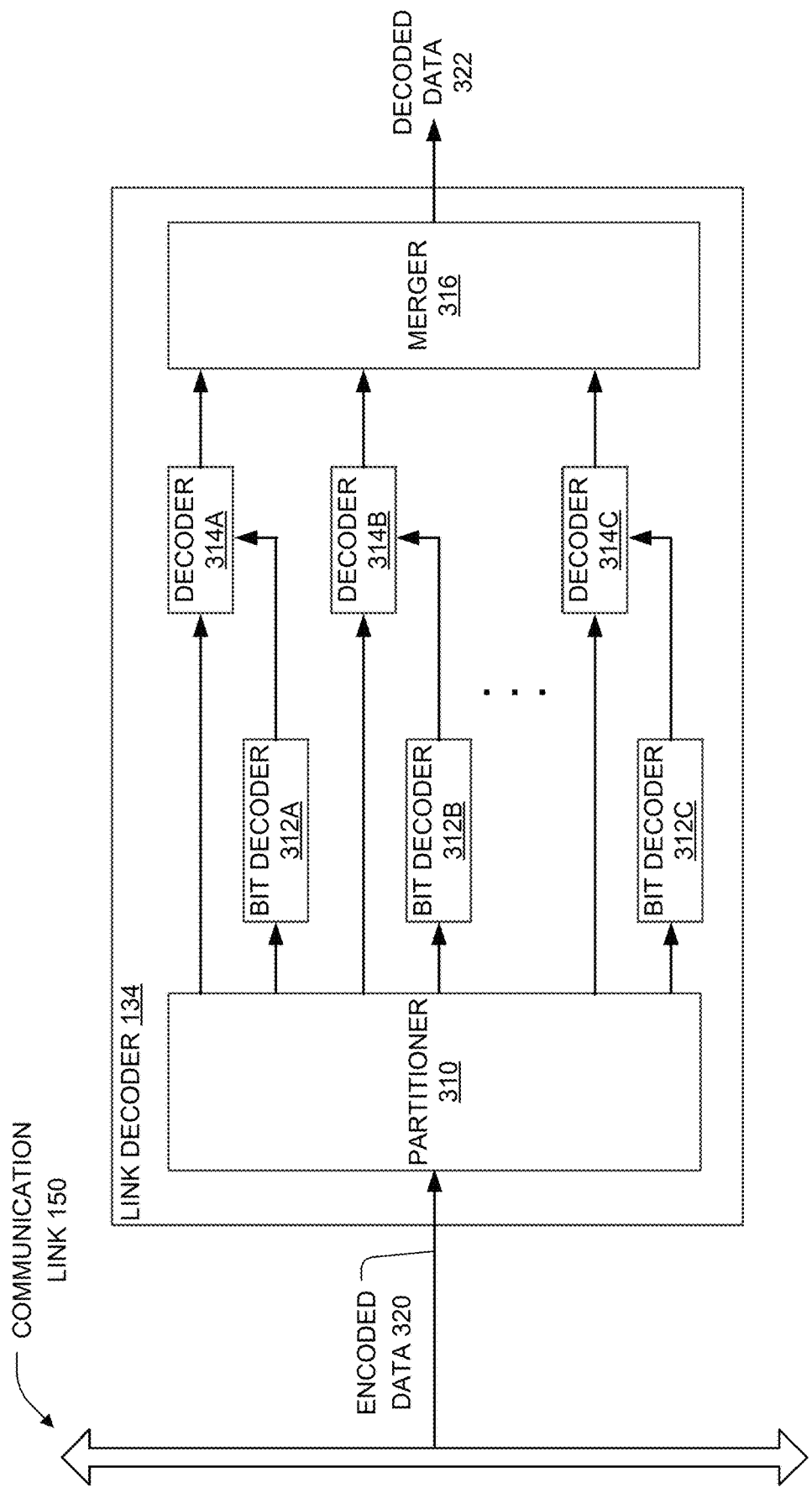
FIG. 3 is a block diagram of a particular illustrative aspect of a link decoder operable to decode data received via a high-speed communication link, in accordance with some examples of the present disclosure.

FIG. 3 illustrates a particular illustrative aspect of the link decoder 134 configured to decode data received via a high-speed communication link, in accordance with some examples of the present disclosure. The link decoder 134 includes a plurality of components that are configured to generate a representation of input data based on encoded data received via the communication link 150.

In a particular implementation, the link decoder 134 includes a partitioner 310, one or more bit decoder(s) 312 coupled to the partitioner 310, one or more decoder(s) 314 coupled to the bit decoder(s) 312, and a merger 316 coupled to the decoder(s) 314. In some implementations, the bit decoder(s) 312 include multiple bit decoders that are each configured to map boundary bits and flag bits to corresponding additional bit values of codewords. For example, the bit decoder(s) 312 may include a bit decoder 312A, a bit decoder 312B, and a bit decoder 312C. Although three bit decoder(s) 312 are shown, in other implementations, the link decoder 134 may include fewer than three or more than three bit decoder(s) 312. Additionally, or alternatively, the decoder(s) 314 may include multiple decoders that are each configured to decode a corresponding codeword formed from a set of bit values of the encoded data and one or more additional bit values. For example, the decoder(s) 314 may include a decoder 314A, a decoder 314B, and a decoder 314C. Although three decoder(s) 314 are shown, in other implementations, the link decoder 134 may include fewer than three or more than three decoder(s) 314. Although shown in FIG. 3 as distinct decoders and bit decoders, in some other implementations, the bit decoders 312A-C correspond to different portions of a single bit decoder, the decoders 314A-C correspond to different portions of a single decoder, or both. Although the link decoder 134 is depicted in FIG. 3 as including the same number of bit decoder(s) 312 as decoder(s) 314, in other implementations, a count of the bit decoder(s) 312 is different than a count of the decoder(s) 314.

Although FIG. 3 illustrates particular components of the link decoder 134, it should be understood that, in other examples, the link decoder 134 can include one or more additional components, one or more different components, or a combination thereof, that are configured to decode encoded data received via the communication link 150. Additionally, or alternatively, although illustrated and described as separate components, such illustration and description is for ease of explanation, and in other implementations, operations of one or more of the partitioner 310, the bit decoder(s) 312, the decoder(s) 314, and the merger 316 may be performed by the same component. In some implementations, the partitioner 310, the bit decoder(s) 312, the decoder(s) 314, the merger 316, or a combination thereof, may include or correspond to one or more processors, circuitry, or other hardware configured to perform the operations described herein, such as one or more ASICs, one or more FPGAs, other circuitry or logic, or a combination thereof.

The partitioner 310 is configured to partition encoded data 320 (e.g., data received via the communication link 150) into boundary bits, flag bits, and multiple sets of bit values that correspond to encoded codewords. The encoded data 320 may be the same as the encoded data 222 sent by the transmitter 142 or the encoded data 320 may be different than the encoded data 222 due to one or more transmission errors. The boundary bits, the flag bits, and the sets of bit values may be identified and portioned based on locations of the corresponding bits within the encoded data 320, a predefined number of codewords, and predefined sizes of codewords. For example, based on the predefined number of codewords and the sizes of the codewords, the partitioner 310 may identify a first set of bit values that correspond to a first codeword as having a size that is one bit smaller than the size of the first codeword and being located at the beginning of the encoded data 320. The partitioner 310 may identify the following bit of the encoded data 320 as a first boundary bit, and the partitioner 310 may identify a second set of bit values that correspond to a second codeword as following the first boundary bit and having a size that is two bits smaller than the size of the second codeword. The second set of bit values is two bits smaller due to the second codeword being in between the first codeword and a third codeword and having a data bit on each end (e.g., a least significant bit and a most significant bit) replaced by a corresponding boundary bit on each end. In some aspects, when the second set of bit values corresponds to a last set of bit values in the encoded data 320, the second set of bit values is one bit smaller than the second codeword. Additional codewords and sets of bit values may be identified in this manner. The partitioner 310 may also identify flag bits as the bits in the encoded data 320 that follow the last set of bit values, optionally after a shield bit. Upon identification of the various bits of the encoded data 320, the partitioner 310 may be configured to partition the bits into groups of multiple sets of bit values, boundary bits, and flag bits for use by the bit decoder(s) 312 and the decoder(s) 314.

The bit decoder(s) 312 are configured to map the boundary bits and the flag bits received from the partitioner 310 to additional bit values of codewords that are omitted from the encoded data 320 (e.g., to prevent the occurrence of the cross-talk pattern in groups of bits formed from adjacent sets of bits). For example, the bit decoder 312A may be configured to map a first boundary bit and a first flag bit to a first pair of additional bit values, the bit decoder 312B may be configured to map a second boundary bit and a second flag bit to a second pair of additional bit values, and the bit decoder 312C may be configured to map an (n−1)th boundary bit and an (n−1)th flag bit to an (n−1)th pair of additional bit values. Although three bit decoders are shown in FIG. 3, in other examples, the link decoder 134 may include more than three or fewer than three bit decoders. Additionally, mapping one boundary bit and one flag bit to two additional bit values (e.g., a pair of additional bit values) is provided as an illustrative example. In other examples, one or more boundary bits and one or more flag bits may be mapped to one or more additional bit values.

The bit decoder(s) 312 are each configured to determine the corresponding additional bit values according to a decoder predefined mapping (e.g., from boundary and flag bits to additional bit values) that is associated with an encoder predefined mapping (e.g., from partial codewords to boundary and flag bits) used at the bit encoder(s) 214 to generate the boundary and flag bits. For example, the encoder predefined mapping used at the bit encoder(s) 214 is designed to prevent a cross-talk pattern from occurring in groupings of bit values from consecutive pairs of adjacent codewords that are transmitted via the same wires of the communication link 150, as described above with reference to FIG. 2. To illustrate, the decoder predefined mapping used by the bit decoder(s) 312 may include or correspond to an inverse of the encoder predefined mapping used by the bit encoder(s) 214 of FIG. 2. In some implementations, the bit decoder(s) 312 include or correspond to a lookup table that is accessed to map boundary bits and flag bits to additional bit values of codewords. Alternatively, the bit decoder(s) 312 may include or correspond to dedicated circuitry, such as logic gates, that are configured to perform the mapping of boundary bits and flag bits to bit values of codewords according to the predefined mapping.

The decoder(s) 314 are configured to decode codewords formed by combining the sets of bit values received from the partitioner 310 and the additional bit values received from the bit decoder(s) 312 to generate representations of blocks of input data associated with the encoded data 320. For example, the decoder 314A may be configured to decode a first codeword formed by combining the first set of bit values and a first subset of the first additional bit values, the decoder 314B may be configured to decode a second codeword formed by combining the second set of bit values, a second subset of the first additional bit values, and a first subset of the second additional bit values, and the decoder 314C may be configured to decode an nth codeword formed by combining the nth set of bit values and the second subset of the (n−1)th additional bit values. Although three decoder(s) 314 are shown in FIG. 3, in other examples, there may be fewer than three or more than three decoder(s) 314. The decoder(s) 314 are each configured to decode the corresponding codeword according to a decoding scheme that is associated with an encoding scheme used at the encoder(s) 212. For example, the encoding scheme used at the encoder(s) 212 is designed to prevent a cross-talk pattern from occurring in consecutive codewords that are transmitted via the same wires of the communication link 150, as described above with reference to FIG. 2. For example, the decoding scheme used by the decoder(s) 314 may be an inverse of the encoding scheme used by the encoder(s) 212 of FIG. 2.

The merger 316 is configured to combine (e.g., merge) the representations of the blocks of input data generated by the decoder(s) 314 to generate decoded data 322. The decoded data 322 corresponds to a representation of input data that is associated with the encoded data 320 received via the communication link 150. To merge the representations of the blocks of input data, the merger 316 may be configured to append each representation of a subsequent block of input data to the representation of a preceding block of input data. For example, for representations of the second block of input data to the last block of input data, the merger 316 may append the representation of the block of input data to the representation of the preceding block of input data to generate an ordered sequence of representations of blocks of input data as the decoded data 322 that is generated by the link decoder 134.

During operation of the link decoder 134, the partitioner 310 may receive the encoded data 320 and partition the encoded data 320 into boundary bits, flag bits, and multiple sets of bit values (e.g., partial codewords). The boundary bits may include a first boundary bit, a second boundary bit, and an (n−1)th boundary bit, the flag bits may include a first flag bit, a second flag bit, and an (n−1)th flag bit, and the multiple sets of bit values may include a first set of bit values, a second set of bit values, a third set of bit values, an (n−1)th set of bit values, and an nth set of bit values. In some implementations, the partitioner 310 ignores a shield bit that is located between the last set of bit values and the flag bits.

The bit decoder(s) 312 may generate additional bit values for forming multiple codewords based on the boundary bits, the flag bits, and at least some bits of the multiple sets of bit values. To generate the additional bit values, the bit decoder(s) 312 may access a predefined mapping to map the boundary bits, flag bits, and received bit values to corresponding pairs of additional bit values. For example, the bit decoder 312A may generate first additional bit values based on the first boundary bit, the first flag bit, at least some of the first set of bit values, and at least some of the second set of bit values. As another example, the bit decoder 312B may generate second additional bit values based on the second boundary bit, the second flag bit, at least some of the second set of bit values, and at least some of a third set of bit values. As another example, the bit decoder 312C may generate (n−1)th additional bit values based on the (n−1)th boundary bit, the (n−1)th flag bit, at least some of an (n−1)th set of bit values, and at least some of the (n−1)th set of bit values.

The decoder(s) 314 may decode codewords formed from sets of bit values and subsets of the additional bits according to a decoding scheme to generate the decoded data 322 corresponding to representations of multiple blocks of input data. For example, the decoder 314A may decode a first codeword formed from a combination of the first set of bit values and a first subset of the first additional bit values to generate a representation of a first block of input data, the decoder 314B may decode a second codeword formed from a combination of the second set of bit values, a second subset of the first additional bit values, and a first subset of the second additional bit values to generate a representation of a second block of input data, and the decoder 314C may decode an nth codeword formed from a combination of the nth set of bit values and a second subset of the nth of additional bit values to generate a representation of an nth block of input data.

The merger 316 may merge the representations of the blocks of input data received from the decoder(s) 314 to generate the decoded data 322. The decoded data 322 corresponds to a representation of input data associated with the encoded data 320 received via the communication link 150. To perform the merging, the merger 316 may concatenate representations of successive blocks of input data to representations of preceding blocks of input data. For example, the merger 316 may generate an ordered sequence that includes the representation of the first block of input data, followed by the representation of the second block of input data, followed by the representation of the nth block of input data, as the decoded data 322. The decoded data 322 may be output by the link decoder 134 for processing by another component. Because the encoded data 320 includes sets of bit values from codewords, boundary bits, flag bits, and an optional shield bit, instead of a shield bit between each data bit, the encoded data 320 can be received and decoded with reduced cross-talk while using less on-chip area for the communication link 150, as compared to other communication links that include shield wires between each data wire to reduce cross-talk.

Figure 4:
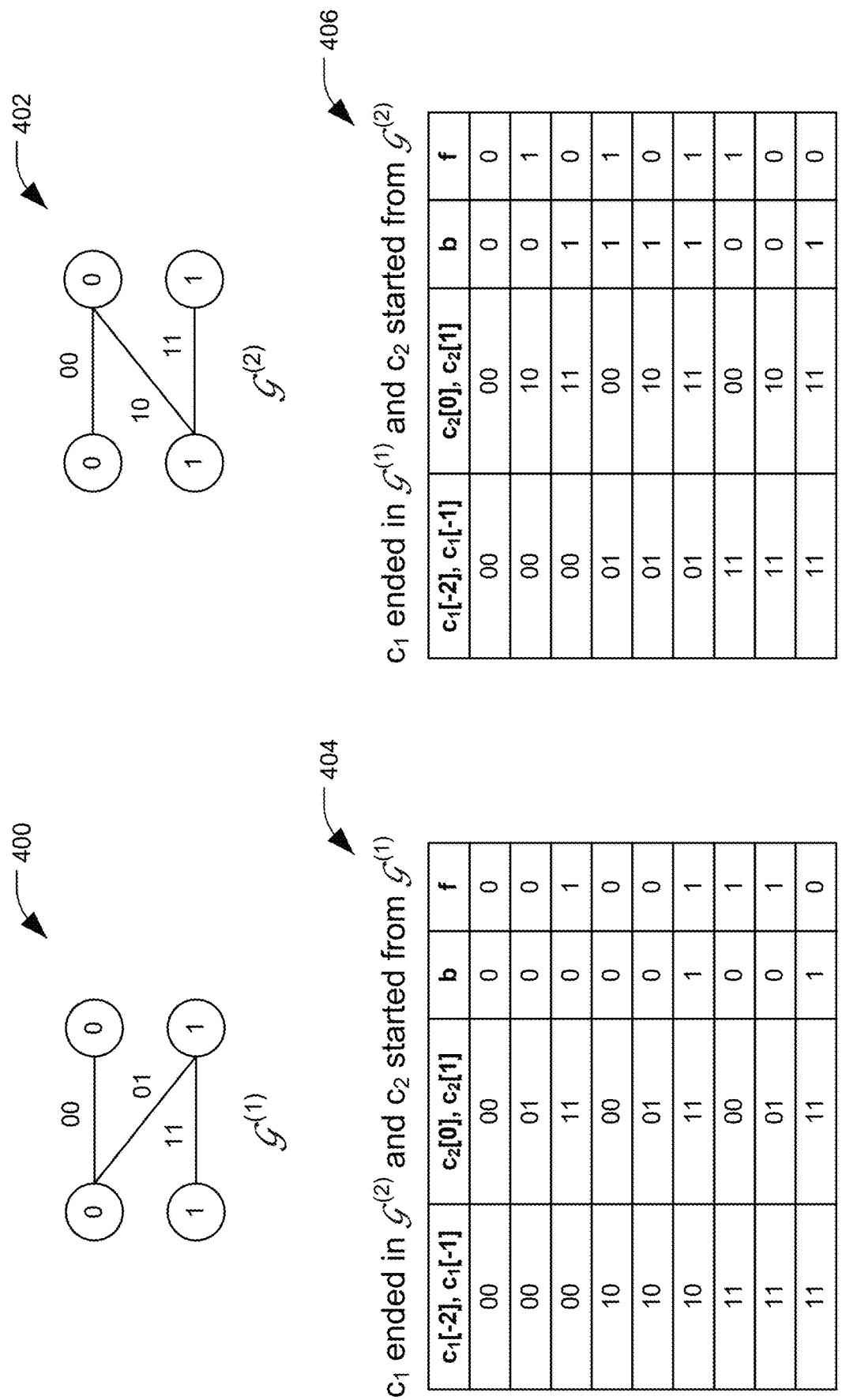
FIG. 4 is a diagram of illustrative aspects of encoding graphs and lookup tables for encoding data for exchange on a high-speed communication link, in accordance with some examples of the present disclosure.

FIG. 4 illustrates aspects of encoding graphs and lookup tables for encoding data for exchange on a high-speed communication link, in accordance with some examples of the present disclosure. In some implementations, the encoding graphs and lookup tables shown in FIG. 4 may be associated with encoding schemes utilized by the link encoder 132 of FIGS. 1 and 2.

As described above, an encoding scheme can be designed to prevent a cross-talk pattern from occurring in pairs of consecutively transmitted codewords. In some implementations, the cross-talk pattern includes two adjacent bits transitioning in opposite directions (e.g., the voltage communicated on adjacent wires transitioning in opposite directions, such as a high-to-low voltage transition adjacent to a low-to-high voltage transition). Such transitions are associated with high cross-coupling capacitance that may cause the voltage on one of the wires to be pulled down or pulled up, thereby resulting in an error in data transmission, propagation delay for the communication link 150, or both. A particular subset of such a cross-talk pattern includes, for a set of three bits, the bits on either side of the middle bit both transitioning in the opposite direction as the transition of the bit in the middle, which may be referred to as a "4-C sequence". Two examples of this pattern exist for pairs of consecutive three-bit codewords: a first example is when the first codeword is 010 and the second codeword is 101, and a second example is when the first codeword is 101 and the second codeword is 010. In the first example, the first bit and the third bit each transition from 0 to 1, and the second bit transitions in the opposite direction, from 1 to 0, from transmission of the first codeword to transmission of the second codeword. Similarly, in the second example, the first bit and the third bit each transition from 1 to 0, and the second bit transitions in the opposite direction, from 0 to 1, from transmission of the first codeword to transmission of the second codeword.

To prevent this particular cross-talk pattern, an encoding scheme can be designed such that, for each codeword that is generated by the encoding scheme, a second codeword generated by the encoding scheme will not cause the above-described bit transitions. For example, for a three-bit codeword, if one of the possible codewords of the encoding scheme is 010, then 101 is not a possible codeword. Similarly, if one of the possible codewords is 101, then 010 is not a possible codeword. One possible technique for designing an encoding scheme that prevents such transitions (e.g., middle bit transitions opposite to adjacent bit transitions) as well as other types of adjacent bit transitions in opposite directions is to constrain the possible sequences of pairs of adjacent bits in codewords generated by the encoding scheme. Such an encoding scheme may be represented by bipartite graphs that include sets of left vertices, right vertices, and edges that connect the left vertices to the right vertices. Traversing such bipartite graphs generates a list of possible two-bit values that can be used to form codewords of the encoding scheme, and cascading bipartite graphs together can form a larger bipartite graph that can be traversed to generate larger than two-bit codewords.

In a particular example illustrated in FIG. 4, the encoding scheme is based on a first bipartite graph 400 ("$\mathcal{G}^{(1)}$") and a second bipartite graph 402 ("$\mathcal{G}^{(2)}$") Traversing the first bipartite graph 400 results in three possible two-digit codewords: 00, 01, and 11 (i.e., 10 is not a possible output), and traversing the second bipartite graph 402 results in three possible two-digit codewords: 00, 10, and 11 (i.e., 01 is not a possible output). By selecting these particular bipartite graphs, which each omit a different possible codeword (e.g., 10 and 01), a combination of the bipartite graphs will yield larger codewords that avoid the particular cross-talk pattern (e.g., that avoid having both 010 and 101 as possible codewords). For example, to generate a three-digit codeword, the first bipartite graph 400 and the second bipartite graph 402 may be cascaded, such that the right vertices of the first bipartite graph 400 are set equal to the left vertices of the second bipartite graph 402. Traversing the cascaded bipartite graph results in five possible three-digit codewords: 000, 010, 011, 110, and 111. As can be appreciated, the possible codewords include 010 but not 101, thereby preventing the cross-talk pattern of one bit transitioning in the opposite direction as the two adjacent bits in consecutively transmitted codewords. In another implementation, a cascaded bipartite graph may be formed by starting with the second bipartite graph 402 followed by the first bipartite graph 400, such that the right vertices of the second bipartite graph 402 are set equal to the left vertices of the first bipartite graph 400. Traversing such a cascaded bipartite graph results in five possible three-digit codewords: 000, 001, 100, 101, and 111, which includes 101 but does not include 010 and thus prevents the same cross-talk pattern in consecutively transmitted codewords.

To generate larger codewords, additional instances of the first bipartite graph 400 and the second bipartite graph 402 may be appended to the cascaded bipartite graph, in this sequence, with each additional bipartite graph adding an additional bit to the codeword. For example, a cascade of three bipartite graphs, the first bipartite graph 400, followed by the second bipartite graph 402, followed by the first bipartite graph 400, may be traversed to generate a four-digit codeword. As another example, a cascade of four bipartite graphs, the first bipartite graph 400, followed by the second bipartite graph 402, followed by the first bipartite graph 400, followed by the second bipartite graph 402, may be traversed to generate a five-digit codeword. In this manner, the encoding scheme may be designed to yield codewords having any preset size through a sequenced cascade of one or more of the first bipartite graph 400 and the second bipartite graph 402. The encoding scheme may be implemented via one or more lookup tables (e.g., lookup tables for each block size of input data), dedicated circuitry such as logic gates, other components, or a combination thereof. In some other implementations, a single bipartite graph (e.g., the first bipartite graph 400 or the second bipartite graph 402) may be cascaded multiple times to form a cascaded graph, or multiple instances of one bipartite graph may be followed by the other bipartite graph, to generate a cascaded bipartite graph for encoding data, although the number of codewords generated by such cascaded bipartite graphs may be less than the number of codewords generated by alternating the first bipartite graph 400 and the second bipartite graph 402 in the cascaded bipartite graph.

A predefined mapping may be designed based on the encoding scheme to enable generation of boundary bits and flag bits, as described above. In some implementations, the predefined mapping is represented as one or more lookup tables, such as a first lookup table 404 and a second lookup table 406 shown in FIG. 4. In some other implementations, the predefined mapping represented by the lookup tables 404, 406 is implemented by dedicated circuitry, such as logic gates, that are configured to perform the predefined mapping. Although shown as two lookup tables 404, 406, the division is for ease of explanation, and in other implementations, a single mapping table (e.g., with an additional field, such as block size) may be used to represent the predefined mapping. In the example shown in FIG. 4, an encoder (e.g., the link encoder 132 of FIG. 1) may access either the first lookup table 404 or the second lookup table 406, based on the codewords being mapped, to map at least one bit of a first codeword ("$c_1$") and at least one bit of a second codeword ("$c_2$") to a boundary bit ("b") and a flag bit ("f"). In this example, the at least one bit of the first codeword includes the two least significant bits of the first codeword, represented as $c_1[-2]$ and $c_1[-1]$, and the two most significant bits of the second codeword, represented as $c_2[0]$ and $c_2[1]$.

The encoding scheme may be designed to partition input data into a first set of blocks having a first size and a second set of blocks having a second size, and due to the different sizes of the blocks in the two sets, codewords encoded from blocks of the first set may be associated with the first lookup table 404, and codewords encoded from blocks of the second set may be associated with the second lookup table 406. For example, the size of the codewords (which corresponds to the size of the blocks), the ordering of the codewords, or other considerations may cause some codewords to be encoded based on a cascaded bipartite graph that ends in an instance of the second bipartite graph 402, and other codewords to be encoded based on a cascaded bipartite graph that ends in an instance of the first bipartite graph 400, and as such, the ordering of possible codewords for some pairs of adjacent codewords corresponds to an ordering represented by the first lookup table 404 that is different than an ordering represented by the second lookup table 406 that corresponds to other pairs of adjacent codewords. Because the encoding scheme is fixed, the ordering of adjacent codewords with respect to the two bipartite graphs 400, 402 will be fixed, each of the bit encoder(s) 214 may be configured to access the correct lookup table based on which codewords, in the sequence of codewords generated based on the input data, are being processed by the respective bit encoder(s) 214 to determine the boundary bit and the flag bit.

Each of the bit encoder(s) 214 accesses the corresponding lookup table to map bits of the pair of adjacent codewords to the boundary bit and the flag bit. For example, based on the bit encoder 214A being assigned to map bit values from a pair of adjacent codewords that correspond to the first lookup table 404, the bit encoder 214A may access the first lookup table 404 based on the values of $c_1[-2]$, $c_1[-1]$, $c_2[0]$, and $c_2[1]$ to identify values of b and f. To illustrate, if the first codeword is 0011011100 and ends in $\mathcal{G}^{(2)}$ and the second codeword is 1110100010 and starts from $\mathcal{G}^{(1)}$ the bit encoder 214A may identify $c_1[-2]$ as 0, $c_1[-1]$ as 0, $c_2[0]$ as 1, and $c_2[1]$ as 1, and based on these values and the first lookup table 404, the bit encoder 214A may determine that b is 0 and f is 1. As another example, the bit encoder 214B may be assigned to map bit values from a first codeword that ends in $\mathcal{G}^{(1)}$ and a second codeword that starts from $\mathcal{G}^{(2)}$ In this example, the bit encoder 214B may access the second lookup table 406 and determine that b is 1 and f is 0 based on the bit values of the two codewords.

After determining the boundary bit and the flag bit according to the first lookup table 404 or the second lookup table 406, the link encoder 132 (e.g., the merger 216) may merge the boundary bit, the flag bit, and the two codewords to generate encoded data that is to be transmitted via a communication link (e.g., the communication link 150 of FIGS. 1-3). Generating the encoded data may include inserting the boundary bit between the codewords and replacing at least one bit of each of the codewords, as well as appending the flag bit to the end of a last codeword. For example, the first codeword and the second codeword may be sequenced in order as the encoded data, and the least significant bit of the first codeword and the most significant bit of the second codeword may be replaced with the boundary bit, such that the encoded data includes . . . $c_1[-3]c_1[-2]$b $c_0[1]c_1[2]$ . . . . Additionally, after the least significant bit of the last codeword, any flag bits may be optionally encoded, using an appropriate encoding scheme, and appended (after an optional shield bit), starting with the flag bit f. An example of such encoding is described further herein with reference to FIG. 6.

Figure 5:
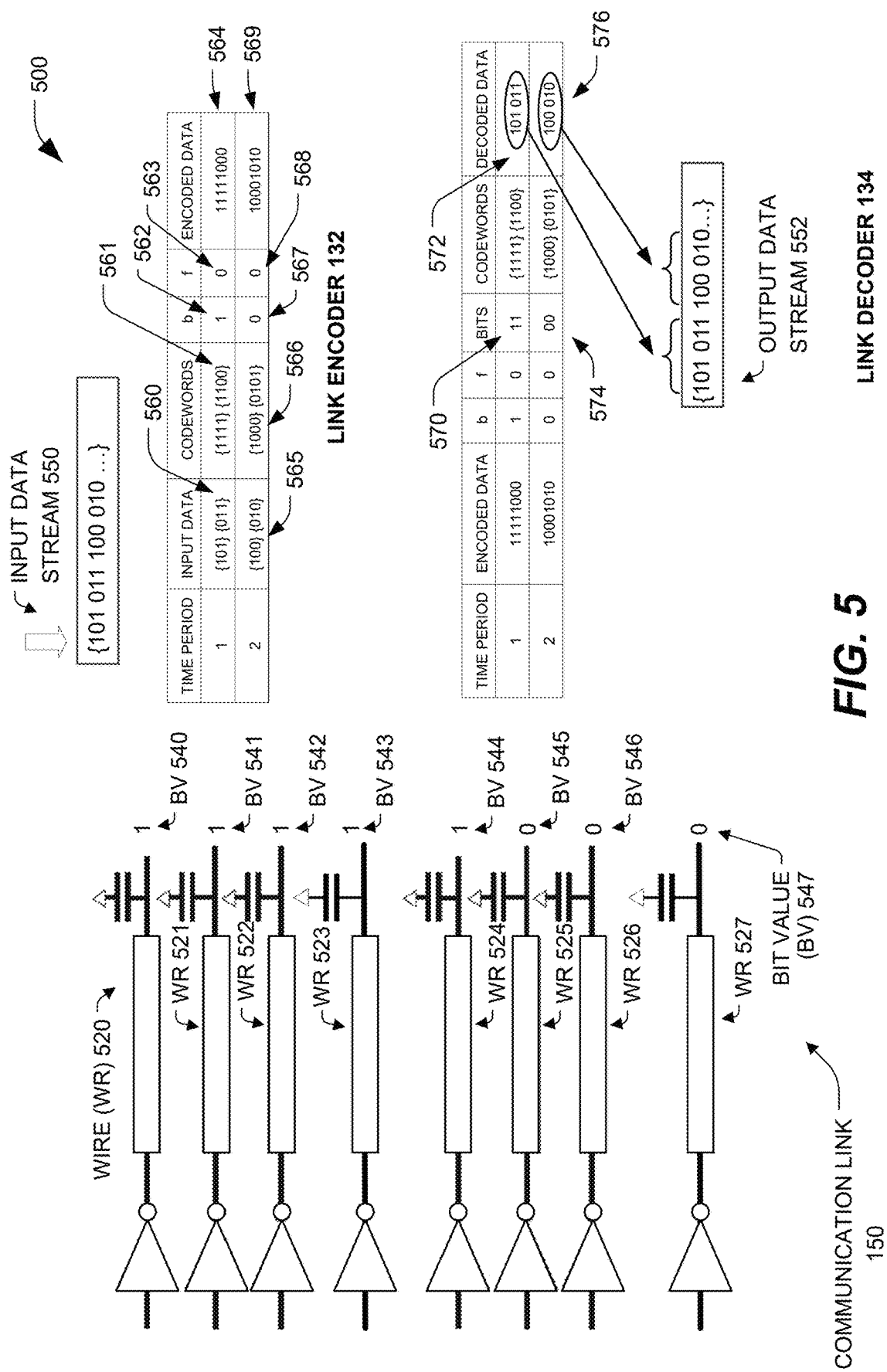
FIG. 5 is a diagram of an illustrative aspect of operations at a link encoder and a link decoder that are configured to reduce occurrence of a cross-talk pattern in exchanged data within and between codewords, in accordance with some examples of the present disclosure.

Referring to FIG. 5, a diagram 500 is shown of an illustrative aspect of operations at a link encoder and a link decoder that are configured to reduce occurrence of a cross-talk pattern in exchanged data within and between codewords, in accordance with some examples of the present disclosure. The operations shown in FIG. 5 may be performed by the link encoder 132 and the link decoder 134 to exchange communications via the communication link 150. In the example shown in FIG. 5, the link encoder 132 and the link decoder 134 are configured to encode data according to an encoding scheme that prevents occurrence of a cross-talk pattern within successively transmitted codewords and between adjacent codewords.

The communication link 150 includes a first subset of wires (e.g., a wire 520, a wire 521, and a wire 522), a first boundary wire (e.g., a wire 523), a second subset of wires (e.g., a wire 524, a wire 525, and a wire 526), and a first flag wire (e.g., a wire 527). The example described herein of the communication link 150 including two subsets of wires, and each subset of wires including three wires, is illustrative. In other examples, the communication link 150 can include fewer than two subsets of wires or more than two subsets of wires and a subset of wires can include fewer than three wires or more than three wires. Additionally, or alternatively, the communication link 150 can include more than one boundary wire, more than one flag wire, the same number of boundary wires as flag wires, a different number of boundary wires than flag wires, or a combination thereof. In some examples, the first boundary wire and the first flag wire are part of multiple boundary wires and multiple flag wires (not shown), respectively. To illustrate, there may be one or more first boundary wires between the first subset of wires and the second subset of wires, one or more second boundary wires between the second subset of wires and a third subset of wires, and so on, followed by the first flag wire and any additional flag wires in the communication link 150. In some implementations, a shield wire is located between the last subset of wires (e.g., corresponding to a last partial codeword) and the first flag wire (e.g., the wire 527). In other implementations, the shield wire is omitted. In some implementations, the one or more flag wires can be prior to the first boundary wires.

A transmitter 142 is configured to apply a voltage that is within a first voltage range (e.g., a low voltage or a logical low voltage) or a second voltage range (e.g., a high voltage or a logical high voltage) to a wire to send a first bit value (e.g., 0) or a second bit value (e.g., 1), respectively, to indicate encoded data (e.g., a bit of a codeword, a flag bit, or a boundary bit) being transmitted via the respective wire of the communication link 150. A receiver 144 is configured to, based on detecting a voltage on the wire, receive the first bit value if the voltage is within the first voltage range or the second bit value if the voltage is in the second voltage range.

During operation, the link encoder 132 obtains an input data stream 550 for transmission via the communication link 150. In a particular example, the link encoder 132 (e.g., the link encoder 132A) obtains the input data stream 550 from the processor 120 to send to the memory 122. In another example, the link encoder 132 (e.g., the link encoder 132B) obtains the input data stream 550 from the memory 122 to send to the processor 120.

The link encoder 132 (e.g., the partitioner 210) may partition the input data stream 550 into a plurality of blocks (indicated by { } in FIG. 5) for transmission during various time periods via the communication link 150. For example, the input data stream 550 may be partitioned into a first set of input blocks 560 (e.g., 101 and 011) and a second set of input blocks 565 (e.g., 100 and 010). In this example, encoded data based on the first set of input blocks 560 may be scheduled for transmission via the first subset of wires (e.g., the wires 520-522) and the second subset of wires (e.g., the wires 524-526) during a first transmission period ("time period 1"). Additionally, encoded data based on the second set of input blocks 565 may be scheduled for transmission via the first subset of wires and the second subset of wires during a second transmission period ("time period 2").

The link encoder 132 (e.g., the encoder(s) 212) may encode the first set of input blocks 560 according to an encoding scheme to generate a first group of codewords 561, as described with reference to FIGS. 1, 2, and 4. For example, the link encoder 132 may encode a first block of input data (e.g., 101) to a first codeword (e.g., 1111) and a second block of input data (e.g., 011) to a second codeword (e.g., 1100). After generating the first group of codewords 561, the link encoder 132 (e.g., the bit encoder(s) 214) may generate a first boundary bit 562 and a first flag bit 563 based on at least one bit of each of the first codeword and the second codeword. In a particular example, the link encoder 132 accesses a predefined mapping to map the two least significant bits of the first codeword (e.g., 11) and the two most significant bits of the second codeword (e.g., 11) to the first boundary bit 562 (e.g., 1) and the first flag bit 563 (e.g., 0). After generating these bits, the link encoder 132 (e.g., the merger 216) may merge the first group of codewords 561 with the first boundary bit 562 and the first flag bit 563, as well as any other codewords and corresponding boundary bits and flag bits to be transmitted via other wires of the communication link 150, to generate first encoded data 564. In the example shown in FIG. 5, the link encoder 132 omits the least significant bit of the first codeword (e.g., 1) and the most significant bit of the second codeword (e.g., 1), followed by inserting the first boundary bit 562 (e.g., 1) between the first partial codeword (e.g., a first set of bit values 111) and the second partial codeword (e.g., a second set of bit values 100). The link encoder 132 appends the first flag bit (e.g., 0) to the end of the second set of bit values (e.g., 100) to generate the first encoded data 564 (e.g., 11111000).

FIG. 5 illustrates an example in which the input data stream 550 is to be sent via the communication link 150 as groups of two partial codewords with a single boundary bit and a single flag bit. In other examples, the communication link 150 may include more wires than shown in FIG. 5, and in such examples, more than two codewords may be generated at a time, in addition to more than one boundary bit and more than one flag bit. To illustrate, the link encoder 132 may repeat the above-described operations for any additional blocks of input data in the input data stream 550 between the block {0111} and the block {1001} and for any corresponding sets of wires, followed by appending the first flag bit 563 (and any other flag bits) to the end of the second partial codeword (or a last partial codeword if there are more than two partial codewords) to generate the first encoded data 564 (e.g., 1111100 . . . 0 . . . ). For example, if there are three codewords, the first encoded data 564 includes a first set of bit values (e.g., 111) that omit a least significant bit of the first codeword, the first boundary bit 562 (e.g., 1), a second set of bit values (e.g., 10) that omits the most significant bit and the least significant bit of the second codeword, a second boundary bit, a third set of bit values that omits the most significant bit of the third codeword, the first flag bit 563 (e.g., 0), and a second flag bit.

In the example shown in FIG. 5, the transmitter 142 transmits the first partial codeword (e.g., 111) via the first subset of wires (e.g., the wires 520-522), the first boundary bit 562 (e.g., 1) via the first boundary wire (e.g., the wire 523), the second partial codeword (e.g., 100) via the second subset of wires (e.g., the wires 524-526), and the first flag bit 563 (e.g., 0) via the first flag wire (e.g., the wire 527) as the first encoded data 564 during the first transmission period. For example, the transmitter 142 sends a first bit value (e.g., 1) of the first partial codeword as a bit value 540 of the wire 520, a second bit value (e.g., 1) of the first partial codeword as a bit value 541 of the wire 521, a third bit value (e.g., 1) of the first partial codeword as a bit value 542 of the wire 522, and a bit value (e.g., 1) of the first boundary bit 562 as a bit value 543 of the wire 523. As another example, the transmitter 142 sends a first bit value (e.g., 1) of the second partial codeword as a bit value 544 of the wire 524, a second bit value (e.g., 0) of the second partial codeword as a bit value 545 of the wire 525, a third bit value (e.g., 0) of the second partial codeword as a bit value 546 of the wire 526, and a bit value (e.g., 0) of the first flag bit 563 as a bit value 547 of the wire 527.

Similarly, the link encoder 132 may encode the second set of input blocks 565 according to an encoding scheme to generate a second group of codewords 566, as described with reference to FIGS. 1, 2, and 4. For example, the link encoder 132 (e.g., the encoder(s) 212) encodes a third block of input data (e.g., 100) to a third codeword (e.g., 1000) and a fourth block of input data (e.g., 010) to a fourth codeword (e.g., 0101). The encoding scheme used by the encoder(s) 212 prevents occurrence of a cross-talk pattern between the first codeword (e.g., 1111) and the third codeword (e.g., 1000) to be transmitted consecutively via the same subset of wires (e.g., the wires 520-522) of the communication link 150. Similarly, the encoding scheme used by the encoder(s) 212 prevents occurrence of a cross-talk pattern between the second codeword (e.g., 1100) and the fourth codeword (0101) to be transmitted consecutively via the same subset of wires (e.g., the wires 524-526) of the communication link 150.

The link encoder 132 (e.g., the bit encoder(s) 214) maps at least one bit of each of the third codeword (e.g., 1000) and the fourth codeword (e.g., 0101) to a second boundary bit 567 (e.g., 0) and a second flag bit 568 (e.g., 0) based on the predefined mapping. The link encoder 132 (e.g., the merger 216) merges the second group of codewords 566, the second boundary bit 567, and the second flag bit 568 (and any additional codewords, boundary bits, and flag bits) by omitting some bits of the second group of codewords 566, inserting the second boundary bit 567, and appending the second flag bit 568, as described above. A third set of bit values (e.g., 100, also referred to as a third partial codeword), the second boundary bit 567 (e.g., 0), a fourth set of bit values (e.g., 101, also referred to as a fourth partial codeword), and the second flag bit 568 (e.g., 0) are to be sent via the first subset of wires (e.g., the wires 520-522), the boundary wire (e.g., the wire 523), the second subset of wires (e.g., the wires 524-526), and the flag wire (e.g., the wire 527), respectively, as second encoded data 569 (e.g., 10001010) during the second transmission period. In other examples, if there are additional blocks of input data that are to be encoded and sent during the second transmission period, the fourth set of bit values may omit bit values from each end of the fourth codeword, similar to as described above for the second set of bit values and the second codeword.

The receiver 144 may receive the first partial codeword (e.g., 111) via the first subset of wires (e.g., the wires 520-522), the first boundary bit 562 (e.g., 1) via the first boundary wire (e.g., the wire 523), the second partial codeword (e.g., 100) via the second subset of wires (e.g., the wires 524-526), and the first flag bit 563 (e.g., 0) via the first flag wire (e.g., the wire 527) as the first encoded data 564 during the first transmission period. The link decoder 134 (e.g., the partitioner 310) may partition the first encoded data 564 into the various sets of bits (e.g., the partial codewords), the first boundary bit 562, and the first flag bit 563, based on predefined size and location information associated with a decoding scheme. The decoding scheme is associated with the encoding scheme used by the link encoder 132 to generate the first encoded data 564 and the second encoded data 569. The link decoder 134 (e.g., the bit decoder(s) 312) may map the first boundary bit 562 (e.g., 1), the first flag bit 563 (e.g., 0), and one or more bit values of the first partial codeword and the second partial codeword to first additional bit values 570 (e.g., 11) to be combined with the sets of bit values (e.g., the partial codewords) from the first encoded data 564 to reproduce the first group of codewords 561. In the example shown in FIG. 5, the link decoder 134 (e.g., the bit decoder(s) 312) maps the bit value of the first boundary bit 562 (e.g., 1), the bit value of the first flag bit 563 (e.g., 0), the bit value of the least significant bit of the first set of bit values (e.g., 1), and the bit value of the most significant bit of the second set of bit values (e.g., 1) to the first additional bit values 570 (e.g., 11) that include the bit value of the least significant bit (e.g., 1) of the first codeword and the bit value of the most significant bit (e.g., 1) of the second codeword.

After generating the first additional bit values 570 (e.g., 11), the link decoder 134 may decode codewords formed from combinations of the first set of bit values (e.g., the first partial codeword) with some of the first additional bit values 570 and the second set of bit values (e.g., the second partial codeword) with some of the first additional bit values 570 to reproduce the first codeword and the second codeword represented by the first encoded data 564. In the example shown in FIG. 5, the first codeword (e.g., 1111) is formed from a combination of the first set of bit values (e.g., 111) with a first bit value of the first additional bit values 570 (e.g., 1), and the second codeword (e.g., 1100) is formed from a combination of the second set of bit values (e.g., 100) with a second bit value of the first additional bit values 570 (e.g., 1).

After reproducing multiple codewords from the first encoded data 564, the link decoder 134 (e.g., the decoder(s) 314) may decode the codewords to generate decoded blocks (e.g., representations of blocks of input data), and the decoded blocks may be combined (e.g., by the merger 316) to generate a representation of input data as first decoded data 572. In the example shown in FIG. 5, the link decoder 134 (e.g., the decoder(s) 314) decodes the first codeword (e.g., 1111) to a first portion (e.g., 101) of the first decoded data 572 and the second codeword (e.g., 1100) to a second portion (e.g., 011) of the first decoded data 572. If the input data stream 550 includes additional blocks between {0111} and {1001} that are to be encoded and sent during the first transmission time, the first decoded data 572 includes additional portions corresponding to representations of the additional blocks decoded from additional codewords derived from the first encoded data 564.

During the second transmission time, the receiver 144 receives the second encoded data 569 (e.g., 10001010) and partitions the second encoded data 569 into the third set of bit values (e.g., 100), the fourth set of bit values (e.g., 101), the second boundary bit 567 (e.g., 0), and the second flag bit 568 (e.g., 0). The link decoder 134 (e.g., the bit decoder(s) 312) maps the second boundary bit 567 (e.g., 0), the second flag bit 568 (e.g., 0), the least significant bit of the third set of bit values (e.g., 0), and the most significant bit of the fourth set of bit values (e.g., 1) to second additional bit values 574 (e.g., 00) that are merged with the sets of bit values to generate the third codeword (e.g., 1000) and the fourth codeword (e.g., 0101). The link decoder 134 (e.g., the decoder(s) 314) decodes the generated codewords to determine second decoded data 576 that is a representation of the portion of the input data stream 550 associated with the second encoded data 569. For example, the link decoder 134 (e.g., the decoder(s) 314 and the merger 316) generates the second decoded data 576 (e.g., 100 010) based on the second group of codewords 566 (e.g., 1000 0101) extracted from the second encoded data 569. In examples in which the input data stream 550 includes additional blocks after {010} that are to be encoded and sent during the second transmission time, the second encoded data 569 includes additional data generated by decoding additional codewords included in the second encoded data 569 prior to the first flag bit 563. After generating the first decoded data 572 and the second decoded data 576, the link decoder 134 may output the first decoded data 572 (e.g., 101 011) and the second decoded data 576 (e.g., 100 010) as output data of an output data stream 552 (e.g., 101 011 100 010). In a particular example, the link decoder 134 (e.g., the link decoder 134A) outputs the output data stream 552 to the processor 120 based on encoded data received from the memory 122. In another example, the link decoder 134 (e.g., the link decoder 134B) outputs the output data stream 552 to the memory 122 based on encoded data received from the processor 120.

Because the encoding scheme of the example in FIG. 5 is designed to prevent the cross-talk pattern from occurring in successively transmitted codewords via the same wires of the communication link 150, adjacent bits do not transition in opposite directions, from the first codeword to the third codeword or from the second codeword to the fourth codeword. Additionally, the example shown in FIG. 5 reduces or prevents the occurrence of the cross-talk pattern between adjacent codewords, such that adjacent bits from two different codewords do not transition in opposite directions. To illustrate, this technical advantage of reducing cross-talk is achieved at least by generating encoded data that includes at least one boundary bit between representations of codewords (e.g., partial codewords corresponding to sets of bit values that omit at least one bit value of the respective codewords). The predefined mapping of codeword bit values to boundary bits can be designed to prevent cross-talk pattern. In some implementations, because the boundary bits replace some bits of the codewords, the predefined mapping of codewords to boundary bits can be designed such that all combinations of partial codewords and boundary bits do not include the cross-talk pattern. Additionally, the predefined mapping can include flag bits, that are located at an end of the encoded data, such that the addition of boundary bits can occur without sacrificing accuracy or increasing the number of bits, and corresponding wires, in the communication link 150 (e.g., because the boundary and flag bits replace the same number of bits that are omitted from the codewords). In some implementations, the predefined mapping is also designed such that the cross-talk pattern does not occur in flag bits (or the number of flag bits is sufficiently few that the likelihood of the cross-talk pattern occurring is low). In some other implementations, the flag bits are encoded according to an encoding scheme (e.g., the same encoding scheme), and optionally separated from the bit values of the last partial codeword, to reduce or prevent occurrence of the cross-talk pattern in the flag bits.

Figure 6:
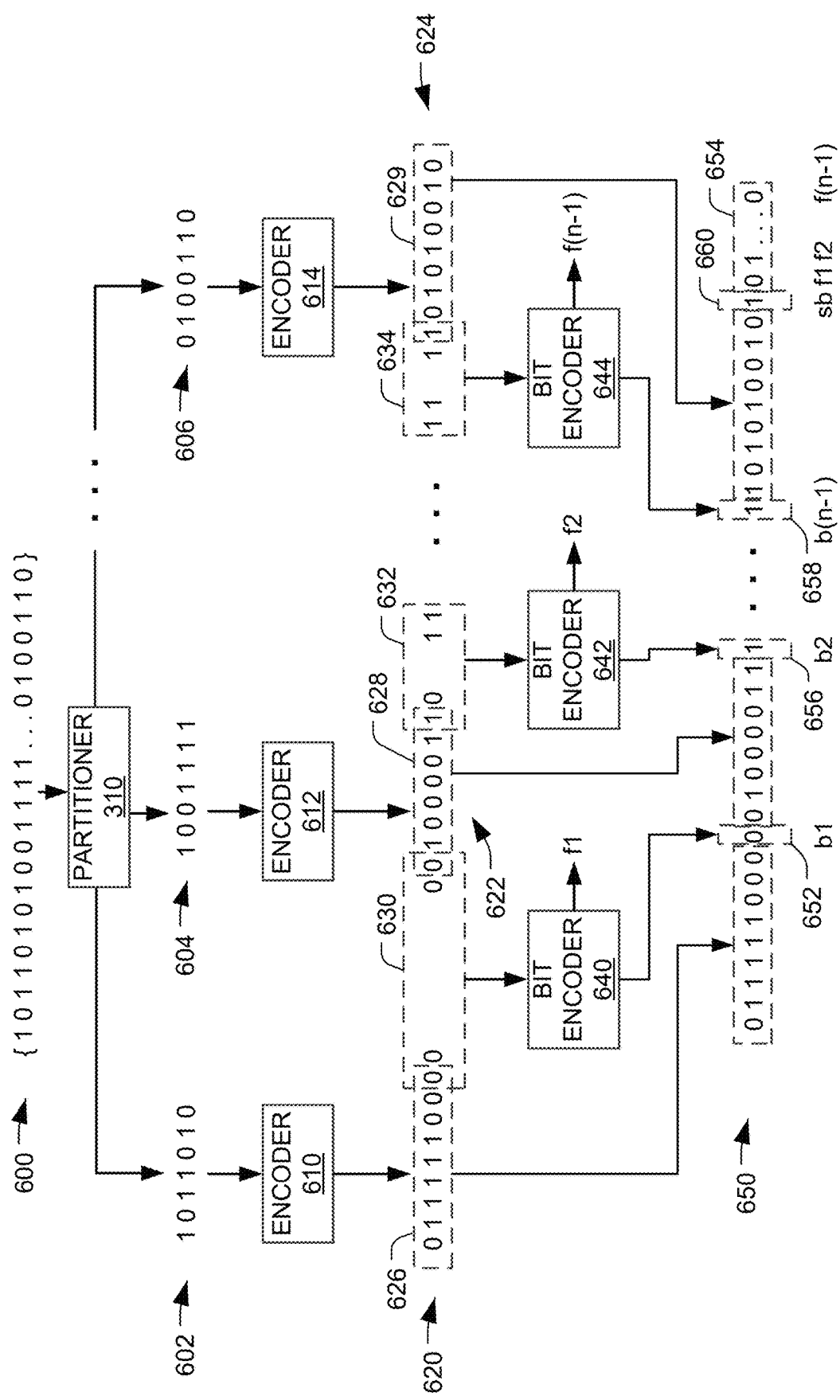
FIG. 6 is a diagram of illustrative aspects of operations at a link encoder associated with an example of generating boundary bits and flag bits, in accordance with some examples of the present disclosure.

Referring to FIG. 6, a diagram of illustrative aspects of operations at a link encoder associated with an example of generating boundary bits and flag bits, in accordance with some examples of the present disclosure, is shown. The example operations shown in FIG. 6 may be performed by the link encoder 132.

An input data stream 600 (e.g., 10110101001111 . . . 0100110) that is to be communicated via a communication link 150 may be partitioned by partitioner 310 into multiple blocks of input data, including a first block 602 (e.g., 1011010), a second block 604 (e.g., 1001111), and an nth block 606 (e.g., 0100110). In the example shown in FIG. 6, each of the blocks 602-606 is an m-bit block, where a size (m) of each of the blocks 602-606 is seven bits. In other implementations, n may be greater than three or less than three (e.g., the input data stream 600 may be portioned into more than three or fewer than three blocks), m may be greater than three or less than seven (e.g., each block may include more than seven bits or fewer than seven bits), at least one block may have a different size than other blocks, or a combination thereof.

After partitioning into the blocks 602-606, each block may be provided to a corresponding encoder to encoder to encode the blocks to generate respective codewords. For example, a first encoder 610 encodes the first block 602 to generate a first codeword 620 (e.g., 0111110000), a second encoder 612 encodes the second block 604 to generate a second codeword 622 (e.g., 0010000110), and an nth encoder 614 encodes the nth block to generate an nth codeword 624 (e.g., 1101010010). The encoders 610-614 may correspond to encoders 212A-C, which may correspond to a single encoder, such as the link encoder 132. In the example shown in FIG. 6, the size of each of the codewords 620-624 is three bits larger than the size of the corresponding block 602-606. In other implementations, the size of each of the codewords 620-624 may be larger than the size of the corresponding block 602-606 by fewer than three or more than three bits, or the size of each of the codewords 620-624 may be the same as the size of the corresponding block 602-606. Although each of the blocks 602-606 are shown in FIG. 6 as having the same size, and each of the codewords 620-624 are shown as having the same size, in other implementations, the size of one or more of the codewords 620-624 may be different than the size of the other codewords, the size of one or more of the blocks 602-606 may be different than the size of the other blocks, or both.

Subsets of the codewords 620-624 may be provided to corresponding bit encoders that, based on a predefined mapping, map the bit values to corresponding boundary bits and flag bits. For example, a subset 630 (e.g., 0000) of the first codeword 620 and the second codeword 622 that includes at least one bit of each of the first codeword 620 and the second codeword 622 may be provided to a first bit encoder 640 to generate a first boundary bit 652 (e.g., 0) and a first flag bit (e.g., 0) of flag bits 654. As another example, a subset 632 (e.g., 1011) of the second codeword 622 (e.g., 0010000110) and a third codeword (e.g., 11 . . . ) that includes at least one bit of each of the second codeword 622 and the third codeword may be provided to a second bit encoder 642 to generate a second boundary bit 656 (e.g., 1) and a second flag bit (e.g., 1) of the flag bits 654. As another example, a subset 634 (e.g., 1111) of an (n−1)th codeword (e.g., . . . 11) and the nth codeword 624 (e.g., 1101010010) that includes at least one bit of each of the (n−1)th codeword and the nth codeword 624 may be provided to an (n−1)th bit encoder 644 to generate an (n−1)th boundary bit 658 (e.g., 1) and an (n−1)th flag bit (e.g., 0) of the flag bits 654. In these examples, the subsets 630-634 include two least significant bits of a sequentially first codeword and two most significant bits of a sequentially second codeword, for each corresponding pair of codewords. In other examples, the subsets 630-634 include fewer than two or more than two least significant bits of the sequentially first codeword and fewer than two or more than two most significant bits of the sequentially second codeword. The bit encoders 640-644 may correspond to bit encoders 214A-C, which may correspond to a single bit encoder.

Sets of bit values from each of the codewords 620-624 (e.g., partial codewords), the boundary bits 652, 656, 658, and the flag bits 654 may be merged to generate encoded data 650. The sets of bit values may omit at least one bit from each respective codeword, and the corresponding boundary bit may be inserted between the sets of bit values (e.g., the partial codewords) in the encoded data 650. Stated another way, each boundary bit may replace, in the encoded data 650, at least one bit of each of the codewords from which the boundary bit is generated. For example, the first boundary bit 652 ("b1") may be inserted between a first set of bit values 626 (e.g., 011111000) that omits a least significant bit (e.g., 0) of the first codeword 620 and a second set of bit values 628 (e.g., 01000011) that omits a most significant bit (e.g., 0) and a least significant bit (e.g., 0) of the second codeword 622. As another example, the second boundary bit 656 ("b2") may be inserted between the second set of bit values 628 and a third set of bit values (not shown) that omits a most significant bit (e.g., 1) and a least significant bit of a third codeword. As another example, the (n−1)th boundary bit 658 ("b(n−1)") may be inserted between a (n−1)th set of bit values (not shown) that omits a most significant bit and a least significant bit (e.g., 1) of an (n−1)th codeword and an nth set of bit values 629 (e.g., 101010010) that omits a most significant bit (e.g., 1) of the nth codeword 624. In other implementations, the sets of bit values may be formed by omitting more bit values or fewer bit values from corresponding codewords, the count of boundary bits may be more than one, or both. Additionally, in some implementations, the flag bits 654 may be appended to the end of the last set of bit values (e.g., the nth set of bit values 629), in sequential order (e.g., a first flag bit ("f1"), followed by a second flag bit ("f2"), to an (n−1)th flag bit ("f(n−1)")), in the encoded data 650. In other implementations, the flag bits 654 may be appended in another location (e.g., prior to the first set of bit values 626), in a different order (e.g., a reverse order), or both.

In some implementations, a shield bit 660 ("sb") may be located between the flag bits 654 and the nth set of bit values 629 in the encoded data 650. The shield bit 660 may correspond to a shield wire that is located between the last data wires (e.g., associated with the nth set of bit values 629) and the flag wires (e.g., associated with the flag bits 654) in a communication link 150. The shield wire prevents a transition in either of the adjacent wires (e.g., that are configured to transmit a data bit and a flag bit) from having an effect on the other of the adjacent wires. Having shield wires between each pair of wires of the communication link 150 can be costly in terms of available space and thus a single shield wire (e.g., corresponding to the shield bit 660) can be used to separate wires that transmit data values from wires that carry flag bits, as the predefined mapping on which the flag bits are based may not be designed to prevent a cross-talk pattern from occurring between a codeword and flag bits. In some other implementations, the shield bit 660 is omitted, and no shield wire is located between the last data wire and the first flag wire.

Figure 7:
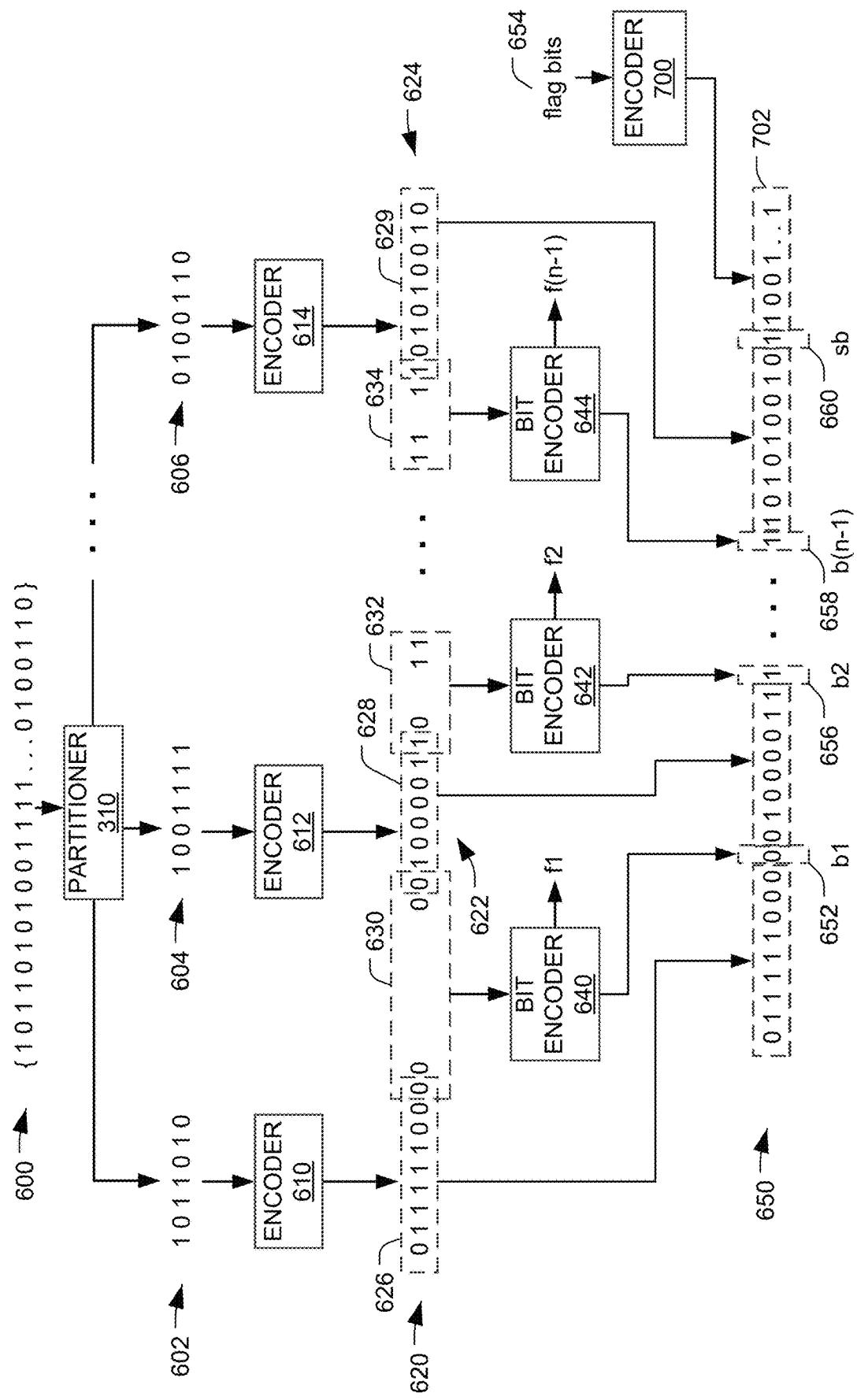
FIG. 7 is a diagram of illustrative aspects of operations at a link encoder associated with an example of generating boundary bits and encoded flag bits, in accordance with some examples of the present disclosure.

Referring to FIG. 7, a diagram of illustrative aspects of operations at a link encoder associated with an example of generating boundary bits and encoded flag bits, in accordance with some examples of the present disclosure, is shown. The example operations shown in FIG. 7 may be performed by the link encoder 132. Operations shown in FIG. 7 are similar to those described above with reference to FIG. 6, except that, once the flag bits 654 are generated, the flag bits 654 are provided to an encoder 700 that encodes the flag bits 654 to generate encoded flag bits 702. The encoder 700 may encode the flag bits 654 according to the same encoding scheme used by the encoders 610-614, so that the cross-talk pattern is prevented from occurring in the encoded flag bits 702 (e.g., between consecutively transmitted encoded flag bits). The encoded flag bits 702 may be appended to the end of the last set of bit values (e.g., the nth set of bit values 629) in the encoded data 650. Because the encoded flag bits 702 are encoded using an encoding scheme that prevents the cross-talk pattern, the encoded flag bits 702 may include more bits than the flag bits 654 of FIG. 6. Optionally, the shield bit 660 may be located between the encoded flag bits 702 and the nth set of bit values 629 in the encoded data 650.

Figure 8:
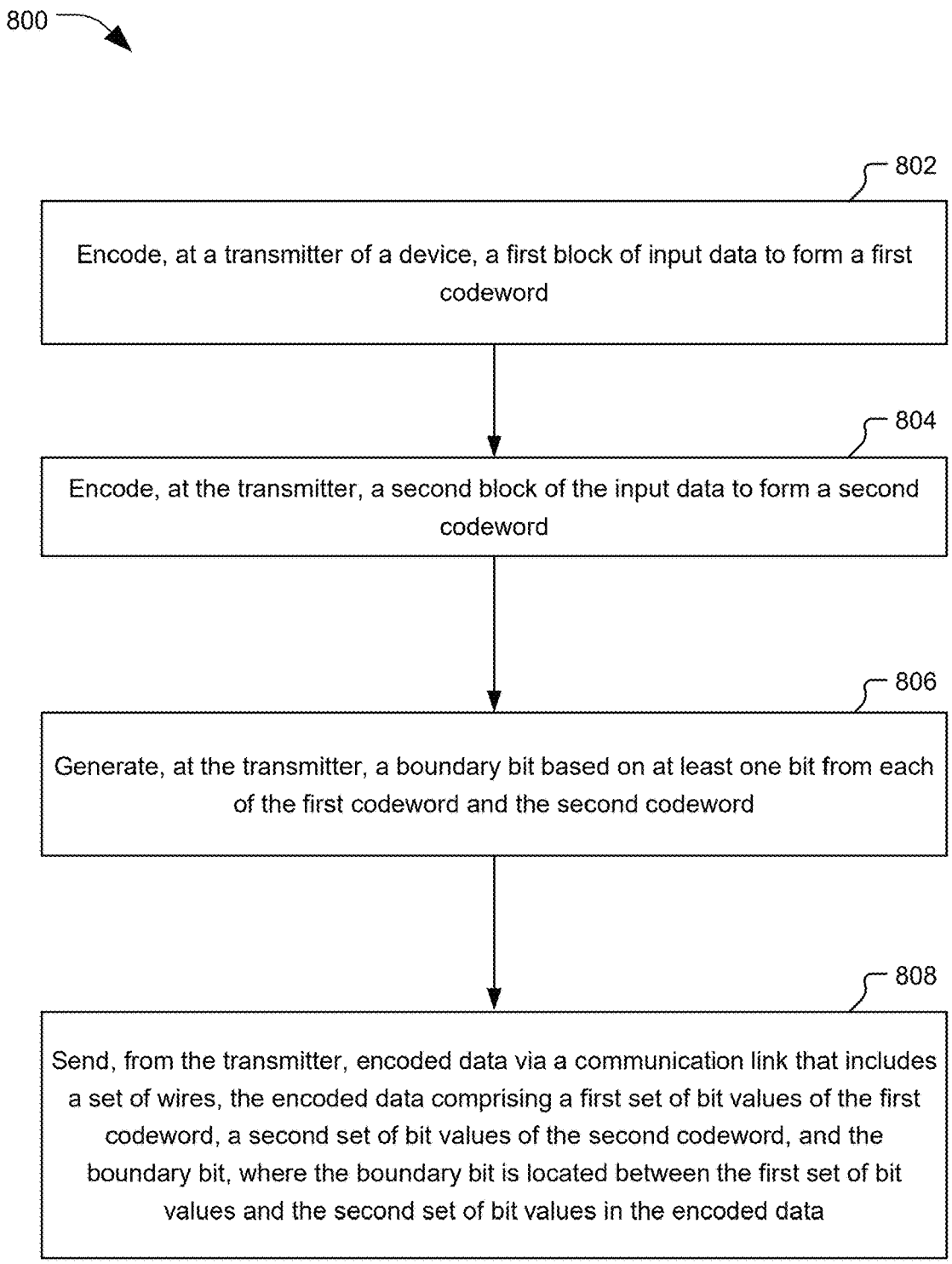
FIG. 8 is a diagram of a particular implementation of a method of transmitting data using a high-speed communication link, in accordance with some examples of the present disclosure.

Referring to FIG. 8, a particular implementation of a method 800 of transmitting data using a high-speed communication link is shown. In a particular aspect, one or more operations of the method 800 are performed at least by one of the transmitter 142, the link encoder 132, the device 102, the system 100 of FIGS. 1-3 and 5, the partitioner 210, the encoder(s) 212, the bit encoder(s) 214, the merger 216 of FIG. 2, or a combination thereof.

The method 800 includes encoding, at a transmitter of a device, a block of input data to form a first codeword, at block 802. For example, a link encoder 132 (e.g., the encoder(s) 212) of a transmitter 142 of the device 102 encodes a first block of input data (e.g., 101) to be sent via a set of wires of the communication link 150 to form a first codeword (e.g., 1111), as described with reference to FIGS. 1, 2, and 5-7. In some implementations, the first block is encoded based on an encoding scheme that is configured to prevent a cross-talk pattern in encoded codewords. The cross-talk pattern may include two adjacent bits transitioning in opposite directions. An example of one type of cross-talk pattern includes, for a group of three bits, a middle bit (e.g., a "victim" bit) transitioning in an opposite direction as two adjacent (e.g., surrounding) bits, as described with reference to FIG. 4.

The method 800 also includes encoding, at the transmitter, a second block of the input data to form a second codeword, at block 804. For example, the link encoder 132 (e.g., the encoder(s) 212) encodes a second block of the input data (e.g., 011) to form a second codeword (e.g., 1100), as described with reference to FIGS. 1, 2, and 5-7.

The method 800 includes generating, at the transmitter, a boundary bit based on at least one bit from each of the first codeword and the second codeword, at block 806. For example, the link encoder 132 (e.g., the bit encoder(s) 214) generates a boundary bit (e.g., 1) based on at least one bit of the first codeword (e.g., 11) and at least one bit of the second codeword (e.g., 11), as described with reference to FIGS. 1, 2, and 5-7.

The method 800 further includes sending, from the transmitter, encoded data via a communication link that includes a set of wires, at block 808. For example, the transmitter 142 sends encoded data generated by the link encoder 132 (e.g., the merger 216) via the communication link 150, as described with reference to FIGS. 1, 2, and 5-7. The encoded data includes a first set of bit values of the first codeword (e.g., 111), a second set of bit values of the second codeword (e.g., 100), and the boundary bit (e.g., 1). The boundary bit is located between the first set of bit values and the second set of bit values in the encoded data. Examples of encoded data are shown and described with reference to FIGS. 5-7.

In some implementations, the method 800 also includes generating, at the transmitter, a flag bit (e.g., 0) based on the at least one bit from each of the first codeword and the second codeword. The encoded data further includes the flag bit, which is located after the second set of bit values in the encoded data. For example, the link encoder 132 (e.g., the bit encoder(s) 214) generates a flag bit (e.g., 0) based on at least one bit of the first codeword (e.g., 11) and at least one bit of the second codeword (e.g., 11), as described with reference to FIGS. 1, 2, and 5-7. In some such implementations, the method 800 further includes accessing, at the transmitter, a predefined mapping to map the at least one bit from each of the first codeword and the second codeword to the boundary bit and the flag bit. For example, the link encoder 132 (e.g., the bit encoder(s) 214) may access a predefined mapping that is represented by a lookup table, as described with reference to FIG. 4. In such implementations, the method 800 also includes inserting, at the transmitter, the boundary bit between the first set of bit values and the second set of bit values in the encoded data and appending, at the transmitter, the flag bit to a set of bit values in the encoded data, the set of bit values associated with a last codeword that is encoded from the input data. For example, the link encoder 132 may insert boundary bits between sets of bit values (e.g., partial codewords) and append flag bits to the end of a last set of bit values to generate the encoded data, as described with reference to FIGS. 1, 2, and 5-7.

In implementations that include generation of the flag bit, the method 800 may optionally include inserting, at the transmitter, a shield bit between the set of bit values associated the last codeword and the flag bit. The shield bit has a particular value that is selected to prevent a cross-talk pattern between the flag bit and the last set of bit values. For example, the link encoder 132 may insert a shield bit between the last set of bit values and the flag bits to form the encoded data, as described with reference to FIGS. 1, 2, 6, and 7. Additionally or alternatively, the method 800 may include, prior to adding the flag bit to the encoded data, encoding a plurality of flag bits that includes at least the flag bit. For example, the link encoder 132 (e.g., the encoder 700) may encode the generated flag bits prior to appending the encoded flag bits 702 to the last set of bit values in the encoded data, as described with reference to FIGS. 1, 2, and 7. To illustrate, the link encoder 132 (e.g., the encoder 700) may use an encoding scheme that prevents occurrence of a cross-talk pattern, as described with reference to FIG. 4, within the flag bits.

It should be noted that while FIG. 8 shows example blocks of method 800, in some implementations, the method 800 may include additional blocks, fewer blocks, different blocks, or differently arranged blocks than those depicted in FIG. 8. The method 800 of FIG. 8 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method 800 of FIG. 8 may be performed by a processor that executes instructions, such as described with reference to FIG. 10.

Figure 9:
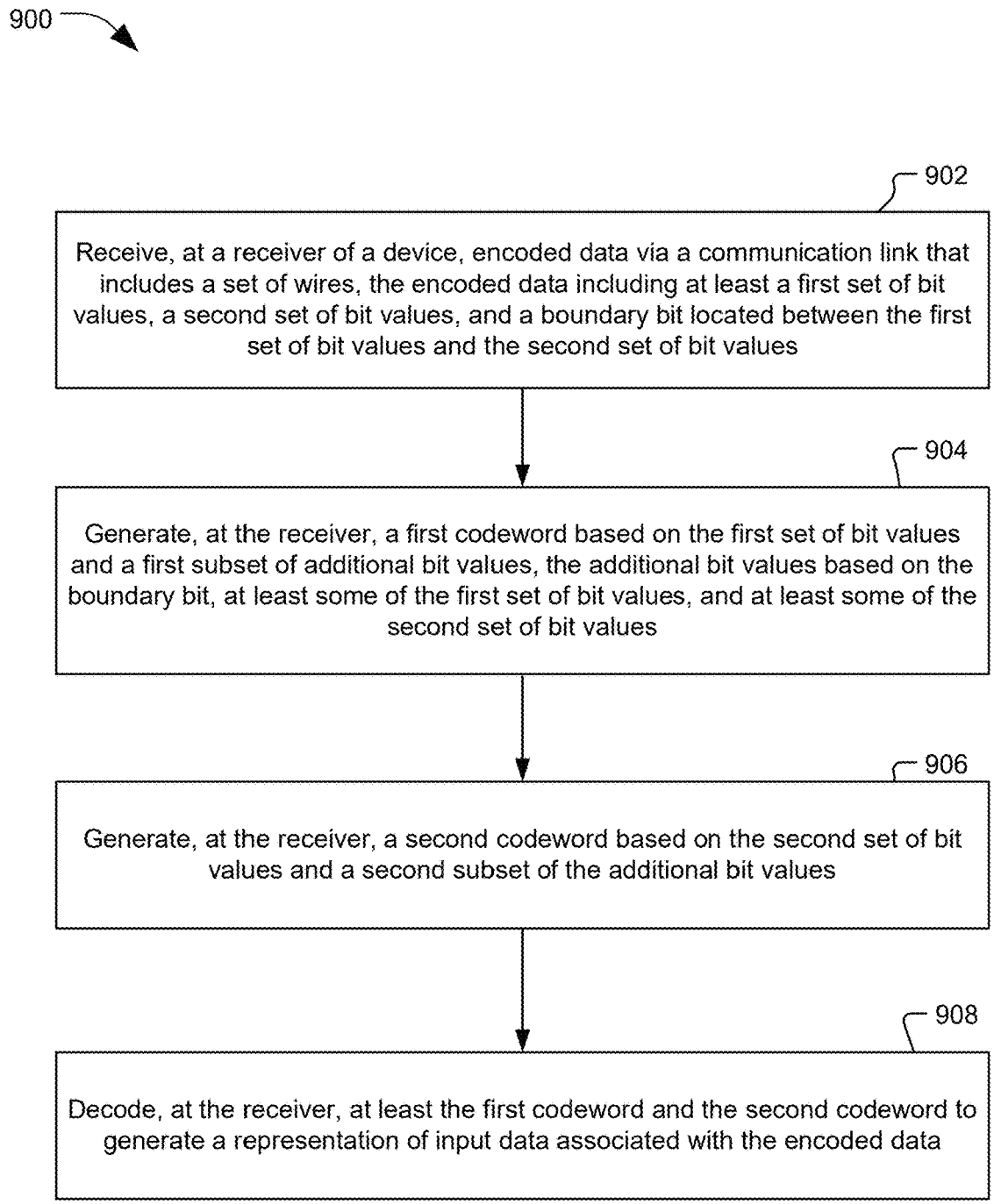
FIG. 9 is a diagram of a particular implementation of a method of receiving data using a high-speed communication link, in accordance with some examples of the present disclosure.

Referring to FIG. 9, a particular implementation of a method 900 of receiving data using a high-speed communication link is shown. In a particular aspect, one or more operations of the method 900 are performed by at least one of the receiver 144, the link decoder 134, the device 102, the system 100 of FIGS. 1-3, the partitioner 310, the bit decoder(s) 312, the decoder(s) 314, the merger 316, or a combination thereof.

The method 900 includes receiving, at a receiver of a device, encoded data via a communications link that includes a set of wires, at block 902. For example, a link decoder 134 of a receiver 144 of the device 102 receives encoded data via the communication link 150, as described with reference to FIGS. 1, 3, and 5. The encoded data includes at least a first set of bit values, a second set of bit values, and a boundary bit located between the first set of bit values and the second set of bit values. For example, the encoded data is sequenced as described and shown with reference to FIG. 5.

The method 900 also includes generating, at the receiver, a first codeword based on the first set of bit values and a first subset of additional bit values, at block 904. The additional bit values are based on the boundary bit, at least some of the first set of bit values, and at least some of the second set of bit values. For example, the link decoder 134 (e.g., the bit decoder(s) 312) generates additional bit values (e.g., 1111) based at least on the boundary bit (e.g., 1), one or more of the first set of bit values (e.g., 1), and one or more of the second set of bit values (e.g., 1). In such an example, a first subset of the additional bit values (e.g., 1) and the first set of bits (e.g., 111) are combined to form a first codeword (e.g., 1111), as described with reference to FIGS. 1, 3, and 5. In some implementations, the additional bit values (e.g., 1111) include a pair of least significant bits (e.g., 11) of the first codeword and a pair of most significant bits (e.g., 11) of the second codeword, and the first subset (e.g., 1) of the additional bit values includes a least significant bit of the first codeword that is omitted from the encoded data, as described with reference to FIGS. 1, 3, and 5.

The method 900 includes generating, at the receiver, a second codeword based on the second set of bit values and a second subset of the additional bit values, at block 906. For example, the link decoder 134 (e.g., the bit decoder(s) 312) generates a second codeword (e.g., 1100) based on a combination of the second set of bit values (e.g., 100) and a second subset (e.g., 1) of the additional bit values (e.g., 1111), as described with reference to FIGS. 1, 3, and 5. In some implementations, the second subset of the additional bit values (e.g., 1) includes a most significant bit of the second codeword that is omitted from the encoded data, as described with reference to FIGS. 1, 3, and 5.

The method 900 further includes decoding, at the receiver, at least the first codeword and the second codeword to generate a representation of input data associated with the encoded data, at block 908. For example, the link decoder 134 (e.g., the decoder(s) 314) decodes the first codeword and the second codeword to generate a representation of input data (e.g., a concatenation of blocks of decoded data), as described with reference to FIGS. 1, 3, and 5.

In some implementations the encoded data further includes a flag bit located after the second set of bit values, and the additional bit values are determined further based on the flag bit. For example, the link decoder 134 determines the additional bit values based on the boundary bit (e.g., 1), the flag bit (e.g., 0), at least some of the first set of bit values, and at least some of the second set of bit values, as described with reference to FIGS. 1, 3, and 5. In some such implementations, the method 900 further includes accessing a predefined mapping to map the boundary bit, the flag bit, and received bit values to the additional bit values. The predefined mapping at the decoder is associated with (e.g., is an inverse of) a predefined mapping at the encoder that is configured to map codeword bits to boundary bits and flag bits to prevent a cross-talk pattern in a sequence of codewords. For example, the predefined mapping may be an inverse of, or be associated with, the predefined mapping table represented by the lookup tables described with reference to FIG. 4.

It should be noted that while FIG. 9 shows example blocks of method 900, in some implementations, the method 900 may include additional blocks, fewer blocks, different blocks, or differently arranged blocks than those depicted in FIG. 9. The method 900 of FIG. 9 may be implemented by a FPGA device, an ASIC, a processing unit such as a CPU, a DSP, a controller, another hardware device, firmware device, or any combination thereof. As an example, the method 900 of FIG. 9 may be performed by a processor that executes instructions, such as described with reference to FIG. 10.

Figure 10:
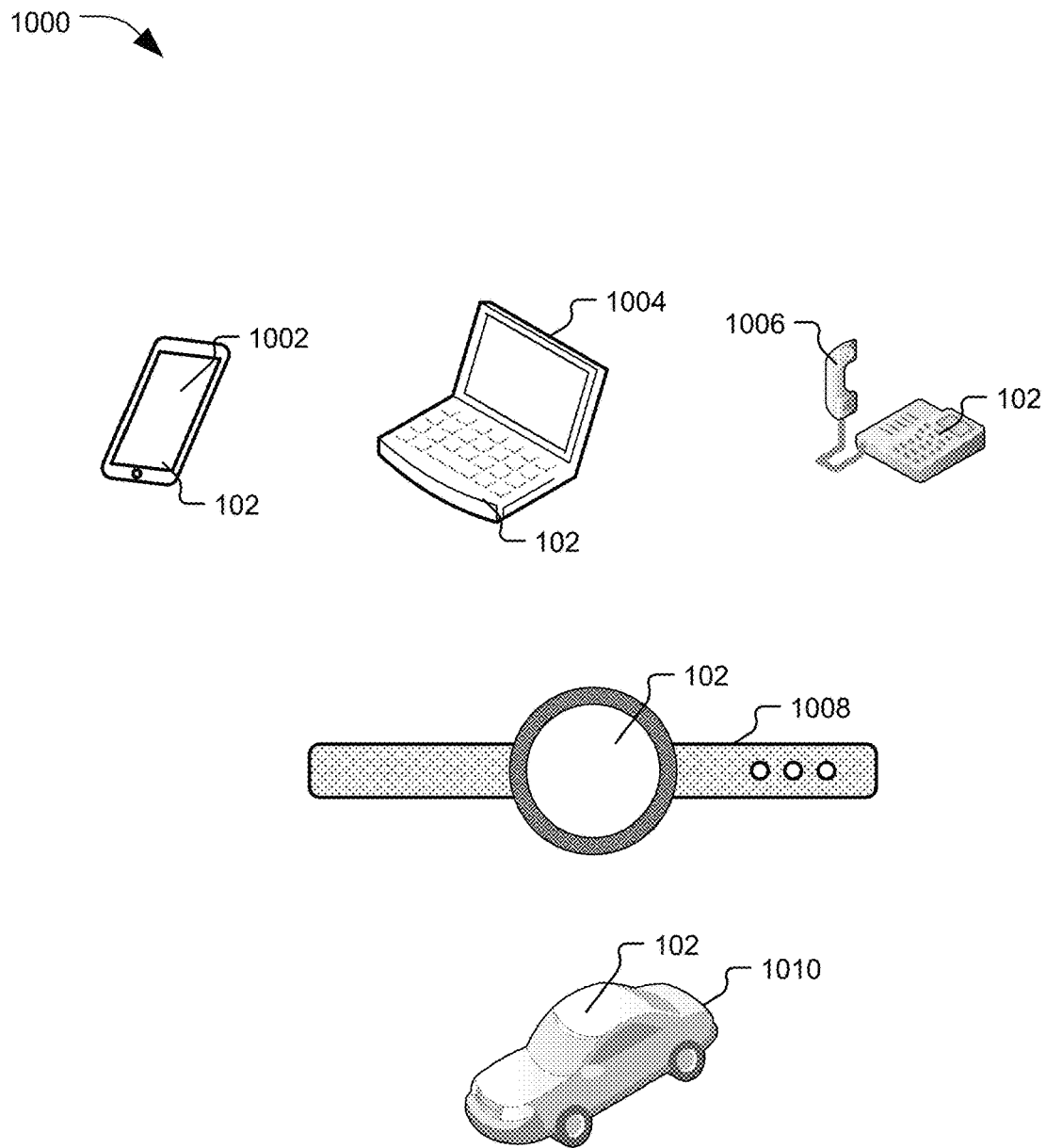
FIG. 10 illustrates various electronic devices that may integrate a high-speed communication link, a transmitter, a receiver, a link encoder, and/or a link decoder described herein.

FIG. 10 illustrates various electronic devices that may include or correspond to the device 102. For example, a mobile phone device 1002, a laptop computer device 1004, a fixed location terminal device 1006, a wearable device 1008, or a vehicle 1010 (e.g., an automobile or an aerial device) may include the device 102. The devices 1002, 1004, 1006 and 1008 and the vehicle 1010 illustrated in FIG. 10 are merely exemplary. Other electronic devices may also feature the device 102 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in vehicles (e.g., autonomous vehicles), or any other device that stores or retrieves data or computer instructions, or any combination thereof.

In a particular implementation, the device 102 includes at least one processor and a memory that stores instructions that are executable by the at least one processor to implement functionality described with reference to a link encoder 132, a link decoder 134, a transmitter 142, a receiver 144, or a combination thereof. In some implementations, a non-transitory computer-readable storage medium (e.g., a computer-readable storage device, such as a memory) includes instructions that, when executed by at least one processor, cause the at least one processor to encode, at a transmitter (e.g., a transmitter 142) of a device (e.g., the device 102), a first block (e.g., the first block 602) of input data (e.g., the input data stream 600) to form a first codeword (e.g., the first codeword 620). The instructions also cause the at least one processor to encode, at the transmitter, a second block (e.g., the second block 604) of the input data to form a second codeword (e.g., the second codeword 622). The instructions cause the at least one processor to generate, at the transmitter, a boundary bit (e.g., the first boundary bit 652) based on at least one bit (e.g., the subset 630) from each of the first codeword and the second codeword. The instructions further cause the at least one processor to send, via the transmitter, encoded data (e.g., the encoded data 650) via a communication link (e.g., the communication link 150) that includes a set of wires. The encoded data includes a first set of bit values (e.g., the first set of bit values 626) of the first codeword, a second set of bit values (e.g., the second set of bit values 628) of the second codeword, and the boundary bit. The boundary bit is located between the first set of bit values and the second set of bit values in the encoded data.

In some implementations, a non-transitory computer-readable medium (e.g., a computer-readable storage device, such as a memory) includes instructions that, when executed by at least one processor, cause the at least one processor to receive, at a receiver (e.g., a receiver 144) of a device (e.g., the device 102), encoded data (e.g., the first encoded data 564) via a communications link (e.g., the communication link 150) that includes a set of wires. The encoded data includes at least a first set of bit values (e.g., a set of bit values that correspond to a first codeword of the first group of codewords 561), a second set of bit values (e.g., a set of bit values that correspond to a second codeword of the first group of codewords 561), and a boundary bit (e.g., the first boundary bit 562) located between the first set of bit values and the second set of bit values. The instructions also cause the at least one processor to generate, at the receiver, a first codeword (e.g., a first codeword of the first group of codewords 561) based on the first set of bit values and a first subset of additional bit values. The additional bit values are based on the boundary bit, at least some of the first set of bit values, and at least some of the second set of bit values. The instructions cause the at least one processor to generate, at the receiver, a second codeword (e.g., a second codeword of the first group of codewords 561) based on the second set of bit values and a second subset of the additional bit values. The instructions further cause the at least one processor to decode, at the receiver, at least the first codeword and the second codeword to generate a representation of input data (e.g., the first decoded data 572) associated with the encoded data.

In conjunction with the described implementations, an apparatus includes means for encoding a first block of input data to form a first codeword. For example, the means for encoding the first block can correspond to a link encoder 132, a transmitter 142, the device 102, the system 100 of FIG. 1, the encoder(s) 212 of FIG. 2, a processor, one or more other circuits or components configured to encode a first block of input data to form a first codeword, or any combination thereof.

The apparatus also includes means for encoding a second block of the input data to form a second codeword. For example, the means for encoding the second block can correspond to a link encoder 132, a transmitter 142, the device 102, the system 100 of FIG. 1, the encoder(s) 212 of FIG. 2, a processor, one or more other circuits or components configured to encode a second block of input data to form a second codeword, or any combination thereof.

The apparatus includes means for generating a boundary bit based on at least one bit from each of the first codeword and the second codeword. For example, the means for generating can correspond to a link encoder 132, a transmitter 142, the device 102, the system 100 of FIG. 1, the bit encoder(s) 214 of FIG. 2, a processor, one or more other circuits or components configured to generate a boundary bit based on at least one bit from each of the first codeword and the second codeword, or any combination thereof.

The apparatus further includes means for sending encoded data via a communication link that includes a set of wires. For example, the means for sending can correspond to a link encoder 132, a transmitter 142, the device 102, the system 100 of FIG. 1, a processor, one or more other circuits or components configured to send encoded data via a communication link, or any combination thereof. The encoded data includes a first set of bit values of the first codeword, a second set of bit values of the second codeword, and the boundary bit. The boundary bit is located between the first set of bit values and the second set of bit values in the encoded data.

Also, in conjunction with the described implementations, an apparatus includes means for receiving encoded data via a communication link that includes a set of wires. For example, the means for receiving can correspond to a link decoder 134, a receiver 144, the device 102, the system 100 of FIG. 1, a processor, one or more other circuits or components configured to receive encoded data via a communications link, or any combination thereof. The encoded data includes at least a first set of bit values, a second set of bit values, and a boundary bit located between the first set of bit values and the second set of bit values.

The apparatus also includes means for generating a first codeword based on the first set of bit values and a first subset of additional bit values. For example, the means for generating the first codeword can correspond to a link decoder 134, a receiver 144, the device 102, the system 100 of FIG. 1, the partitioner 310, the bit decoder(s) 312 of FIG. 3, a processor, one or more other circuits or components configured to generate a first codeword based on a first set of bit values and a first subset of additional bit values, or any combination thereof. The additional bit values are based on the boundary bit, at least some of the first set of bit values, and at least some of the second set of bit values.

The apparatus includes means for generating a second codeword based on the second set of bit values and a second subset of the additional bit values. For example, the means for generating the second codeword can correspond to a link decoder 134, a receiver 144, the device 102, the system 100 of FIG. 1, the partitioner 310, the bit decoder(s) 312 of FIG. 3, a processor, one or more other circuits or components configured to generate a second codeword based on a second set of bit values and a second subset of additional bit values, or any combination thereof.

The apparatus further includes means for decoding at least the first codeword and the second codeword to generate a representation of input data associated with the encoded data. For example, the means for decoding can correspond to a link decoder 134, a receiver 144, the device 102, the system 100 of FIG. 1, the decoder(s) 314 of FIG. 3, a processor, one or more other circuits or components configured to decode at least a first codeword and a second codeword to generate a representation of input data associated with encoded data, or any combination thereof.

One or more of the components, processes, features, and/or functions illustrated in FIGS. 1-10 may be rearranged and/or combined into a single component, process, feature or function or embodied in several components, processes, or functions. Additional elements, components, processes, and/or functions may also be added without departing from the disclosure. In some implementations, FIGS. 1-10 and its corresponding description may be used to manufacture, create, provide, and/or produce devices and/or integrated devices.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

Particular aspects of the disclosure are described below in sets of interrelated Examples:

According to Example 1, a system includes a communication link including a set of wires, an encoder coupled to the communication link, and a decoder coupled to the communication link. The encoder is configured to: encode a first block of input data to form a first codeword; encode a second block of the input data to form a second codeword; generate a boundary bit based on at least one bit from each of the first codeword and the second codeword; and send encoded data via the communication link. The encoded data includes a first set of bit values of the first codeword, a second set of bit values of the second codeword, and the boundary bit. The boundary bit is located between the first set of bit values and the second set of bit values in the encoded data. The decoder is configured to decode the encoded data to generate a representation of the input data.

Example 2 includes the system of Example 1, wherein the encoder is configured to encode the first block and the second block based on an encoding scheme, wherein the decoder is configured to decode the encoded data based on a decoding scheme associated with the encoding scheme, and wherein the encoding scheme is configured to prevent a cross-talk pattern in encoded codewords.

Example 3 includes the system of Example 2, wherein the cross-talk pattern includes two adjacent bits transitioning in opposite directions.

Example 4 includes the system of any of Examples 1 to 3, wherein the boundary bit is based on a pair of least significant bits of the first codeword and a pair of most significant bits of the second codeword, and wherein a least significant bit of the first codeword and a most significant bit of the second codeword are omitted from the encoded data.

Example 5 includes the system of any of Examples 1 to 4, wherein the encoder is further configured to generate a flag bit based on the at least one bit from each of the first codeword and the second codeword, wherein the encoded data further comprises the flag bit, and wherein the flag bit is located after the second set of bit values in the encoded data.

Example 6 includes the system of Example 5, wherein, to generate the boundary bit and the flag bit, the encoder is configured to access a predefined mapping to map the at least one bit from each of the first codeword and the second codeword to the boundary bit and the flag bit, the predefined mapping configured to map encoded bits to boundary bits and flag bits to prevent a cross-talk pattern in a sequence of codewords.

Example 7 includes the system of Example 5 or Example 6, wherein the encoded data further comprises a shield bit, and wherein the shield bit is located between the second set of bit values and the flag bit in the encoded data.

Example 8 includes the system of any of Examples 5 to 7, wherein the encoder is further comprised to: encode a third block of the input data to form a third codeword; and generate a second boundary bit based on at least one bit from each of the second codeword and the third codeword, wherein the encoded data further includes a third set of bit values based on the third codeword and the second boundary bit, and wherein the second boundary bit is located between the second set of bit values and the third set of bit values in the encoded data.

Example 9 includes the system of Example 8, wherein the encoder is further configured to generate a second flag bit based on the at least one bit from each of the second codeword and the third codeword, wherein the encoded data further includes the second flag bit, wherein the flag bit is located after the third set of bit values in the encoded data, and wherein the second flag bit is located after the flag bit in the encoded data.

Example 10 includes the system of Example 9, wherein the encoded data includes a plurality of flag bits that are located after the third set of bit values in the encoded data and that include the flag bit and the second flag bit, and wherein the encoder is configured to encode the plurality of flag bits based on a same encoding scheme associated with the first codeword, the second codeword, and the third codeword.

Example 11 includes the system of any of Examples 1 to 10, wherein, to decode the encoded data, the decoder is configured to: determine additional bit values based on the boundary bit, a flag bit included in the encoded data after the second set of bit values, a first subset of the first set of bit values, and a second subset of the second set of bit values; decode the first set of bit values and a first portion of the additional bit values to generate a representation of the first block of the input data; and decode the second set of bit values and a second portion of the additional bit values to generate a representation of the second block of the input data.

Example 12 includes the system of Example 11, wherein the representation of the input data comprises a concatenation of the representation of the first block of the input data and the representation of the second block of the input data.

Example 13 includes the system of any of Examples 1 to 12, wherein the encoded data further includes a third set of bit values of a third codeword, a second boundary bit, a flag bit, and a second flag bit, wherein the second boundary bit is located between the second set of bit values and the third set of bit values in the encoded data, wherein the flag bit is located after the third set of bit values in the encoded data, wherein the second flag bit is located after the flag bit in the encoded data, and wherein the decoder is further configured to: determine first additional bit values based on the boundary bit, the flag bit, a first subset of the first set of bit values, and a second subset of the second set of bit values; determine second additional bit values based on the second boundary bit, the second flag bit, a third subset of the second set of bit values, and a fourth subset of the third set of bit values; decode the first set of bit values and a first portion of the first additional bit values to generate a representation of the first block of the input data; decode the second set of bit values, a second portion of the first additional bit values, and a fifth subset of the second additional bit values to generate a representation of the second block of the input data; and decode the third set of bit values and a sixth subset of the second additional bit values to generate a representation of a third block of the input data.

According to Example 14, a method includes: encoding, at a transmitter of a device, a first block of input data to form a first codeword; encoding, at the transmitter, a second block of the input data to form a second codeword; generating, at the transmitter, a boundary bit based on at least one bit from each of the first codeword and the second codeword; and sending, from the transmitter, encoded data via a communication link that includes a set of wires, the encoded data including a first set of bit values of the first codeword, a second set of bit values of the second codeword, and the boundary bit, wherein the boundary bit is located between the first set of bit values and the second set of bit values in the encoded data.

Example 15 includes the method of Example 14, further including generating, at the transmitter, a flag bit based on the at least one bit from each of the first codeword and the second codeword, wherein the encoded data further includes the flag bit, and wherein the flag bit is located after the second set of bit values in the encoded data.

Example 16 includes the method of Example 15, further including: accessing, at the transmitter, a predefined mapping to map the at least one bit from each of the first codeword and the second codeword to the boundary bit and the flag bit; inserting, at the transmitter, the boundary bit between the first set of bit values and the second set of bit values in the encoded data; and appending, at the transmitter, the flag bit to a set of bit values in the encoded data, the set of bit values associated with a last codeword that is encoded from the input data.

Example 17 includes the method of Example 16, further including: inserting, at the transmitter, a shield bit between the set of bit values associated the last codeword and the flag bit, the shield bit having a particular value that is selected to prevent a cross-talk pattern in a plurality of flag bits that includes the flag bit.

Example 18 includes the method of Example 16 or Example 17, further including encoding, at the transmitter, a third block of the input data to form a third codeword; accessing, at the transmitter, the predefined mapping to map at least one bit from each of the second codeword and the third codeword to a second boundary bit and a second flag bit; inserting, at the transmitter, the second boundary bit between the second set of bit values and a third set of bit values of the third codeword in the encoded data; and appending, at the transmitter, the second flag bit to the flag bit in the encoded data.

Example 19 includes the method of Example 18, further including, at the transmitter and prior to adding the flag bit and the second flag bit to the encoded data, encoding a plurality of flag bits that includes at least the flag bit and the second flag bit.

According to Example 20, a device includes: a communication link that includes a set of wires; and an encoder coupled to the communication link, the encoder configured to: encode a first block of input data to form a first codeword; encode a second block of the input data to form a second codeword; and generate a boundary bit based on at least one bit from each of the first codeword and the second codeword and to send encoded data via the communication link, wherein the encoded data includes a first set of bit values of the first codeword, a second set of bit values of the second codeword, and the boundary bit, and wherein the boundary bit is located between the first set of bit values and the second set of bit values in the encoded data.

Example 21 includes the device of Example 20, wherein the encoder is further configured to: generate a flag bit based on the at least one bit from each of the first codeword and the second codeword, wherein the encoded data further includes the flag bit, and wherein the flag bit is located after the second set of bit values in the encoded data.

Example 22 includes the device of Example 21, wherein the encoder is further configured to: access a predefined mapping to map the at least one bit from each of the first codeword and the second codeword to the boundary bit and the flag bit; insert the boundary bit between the first set of bit values and the second set of bit values in the encoded data; and append the flag bit to a set of bit values in the encoded data, the set of bit values associated with a last codeword that is encoded from the input data.

Example 23 includes the device of Example 22, wherein the encoder is further configured to: insert a shield bit between the set of bit values associated the last codeword and the flag bit, the shield bit having a particular value that is selected to prevent a cross-talk pattern in a plurality of flag bits that includes the flag bit.

Example 24 includes the device of Example 22 or Example 23, wherein the encoder is further configured to: encode a third block of the input data to form a third codeword; access the predefined mapping to map at least one bit from each of the second codeword and the third codeword to a second boundary bit and a second flag bit; insert the second boundary bit between the second set of bit values and a third set of bit values of the third codeword in the encoded data; and append the second flag bit to the flag bit in the encoded data.

According to Example 25, a non-transitory computer-readable storage medium stores instructions that, when executed by at least one processor, cause the at least one processor to: encode, at a transmitter of a device, a first block of input data to form a first codeword; encode, at the transmitter, a second block of the input data to form a second codeword; generate, at the transmitter, a boundary bit based on at least one bit from each of the first codeword and the second codeword; and send, from the transmitter, encoded data via a communication link that includes a set of wires, wherein the encoded data includes a first set of bit values of the first codeword, a second set of bit values of the second codeword, and the boundary bit, and wherein the boundary bit is located between the first set of bit values and the second set of bit values in the encoded data.

According to Example 26, an apparatus includes: means for encoding a first block of input data to form a first codeword; means for encoding a second block of the input data to form a second codeword; means for generating a boundary bit based on at least one bit from each of the first codeword and the second codeword; and means for sending encoded data via a communication link that includes a set of wires, wherein the encoded data includes a first set of bit values of the first codeword, a second set of bit values of the second codeword, and the boundary bit, and wherein the boundary bit is located between the first set of bit values and the second set of bit values in the encoded data.

According to Example 27, a method includes: receiving, at a receiver of a device, encoded data via a communications link that includes a set of wires, wherein the encoded data includes at least a first set of bit values, a second set of bit values, and a boundary bit located between the first set of bit values and the second set of bit values; generating, at the receiver, a first codeword based on the first set of bit values and a first subset of additional bit values, wherein the additional bit values are based on the boundary bit, at least some of the first set of bit values, and at least some of the second set of bit values; generating, at the receiver, a second codeword based on the second set of bit values and a second subset of the additional bit values; and decoding, at the receiver, at least the first codeword and the second codeword to generate a representation of input data associated with the encoded data.

Example 28 includes the method of Example 27, wherein the additional bit values include a pair of least significant bits of the first codeword and a pair of most significant bits of the second codeword, wherein the first subset of the additional bit values includes a least significant bit of the first codeword, and wherein the second subset of the additional bit values includes a most significant bit of the second codeword are omitted from the encoded data.

Example 29 includes the method of Example 27 or Example 28, wherein the encoded data further includes a flag bit located after the second set of bit values, and wherein the additional bit values are determined based further on the flag bit.

Example 30 includes the method of Example 29, wherein determining the additional bit values includes accessing a predefined mapping to map the boundary bit, the flag bit, the at least some of the first set of bit values, and the at least some of the second set of bit values to the additional bit values, and wherein the predefined mapping is configured to map boundary bits, flag bits, and received bit values to encoded bits to prevent a cross-talk pattern in a sequence of codewords.

Example 31 includes the method of Example 30, wherein the encoded data further includes a shield bit located between the second set of bit values and the flag bit, and wherein the first codeword and the second codeword are generated independently of the shield bit.

Example 32 includes the method of Example 30 or Example 31, wherein the encoded data further includes a third set of bit values, a second boundary bit located between the second set of bit values and the third set of bit values, and a second flag bit located after the flag bit, and wherein the method further includes: determining, at the receiver, second additional bit values based on the second boundary bit, the second flag bit, an additional subset of the second set of bit values, and at least some of the third set of bit values, wherein the second codeword is generated based further on a first subset of the second additional bit values; generating, at the receiver, a third codeword based on the third set of bit values and a second subset of the second additional bit values; and decoding, at the receiver, the third codeword to further generate the representation of the input data.

According to Example 33, a device includes: a communication link that includes a set of wires; and a decoder coupled to the communication link, the decoder configured to: receive encoded data via the communication link, wherein the encoded data includes at least a first set of bit values, a second set of bit values, and a boundary bit located between the first set of bit values and the second set of bit values; generate a first codeword based on the first set of bit values and a first subset of additional bit values, wherein the additional bit values are based on the boundary bit, at least some of the first set of bit values, and at least some of the second set of bit values; generate a second codeword based on the second set of bit values and a second subset of the additional bit values; and decode at least the first codeword and the second codeword to generate a representation of input data associated with the encoded data.

Example 34 includes the device of Example 33, wherein the additional bit values include a pair of least significant bits of the first codeword and a pair of most significant bits of the second codeword, wherein the first subset of the additional bit values includes a least significant bit of the first codeword, and wherein the second subset of the additional bit values includes a most significant bit of the second codeword are omitted from the encoded data.

Example 35 includes the device of Example 33 or Example 34, wherein the encoded data further includes a flag bit located after the second set of bit values, and wherein the additional bit values are determined based further on the flag bit.

Example 36 includes the device of Example 35, wherein determining the additional bit values includes accessing a predefined mapping to map the boundary bit, the flag bit, the at least some of the first set of bit values, and the at least some of the second set of bit values to the additional bit values, and wherein the predefined mapping is configured to map boundary bits, flag bits, and received bit values to encoded bits to prevent a cross-talk pattern in a sequence of codewords.

Example 37 includes the device of Example 36, wherein the encoded data further includes a shield bit located between the second set of bit values and the flag bit, and wherein the first codeword and the second codeword are generated independently of the shield bit.

Example 38 includes the device of Example 36 or Example 37, wherein the encoded data further includes a third set of bit values, a second boundary bit located between the second set of bit values and the third set of bit values, and a second flag bit located after the flag bit, and wherein the decoder is further configured to: determine second additional bit values based on the second boundary bit, the second flag bit, an additional subset of the second set of bit values, and at least some of the third set of bit values, wherein the second codeword is generated based further on a first subset of the second additional bit values; generate a third codeword based on the third set of bit values and a second subset of the second additional bit values; and decode the third codeword to further generate the representation of the input data.

According to Example 39, a non-transitory computer-readable storage medium stores instructions that, when executed by at least one processor, cause the at least one processor to: receive, at a receiver of a device, encoded data via a communications link that includes a set of wires, the encoded data including at least a first set of bit values, a second set of bit values, and a boundary bit located between the first set of bit values and the second set of bit values; generate, at the receiver, a first codeword based on the first set of bit values and a first subset of additional bit values, the additional bit values based on the boundary bit, at least some of the first set of bit values, and at least some of the second set of bit values; generate, at the receiver, a second codeword based on the second set of bit values and a second subset of the additional bit values; and decode, at the receiver, at least the first codeword and the second codeword to generate a representation of input data associated with the encoded data.

Example 40 includes the non-transitory computer-readable storage medium of Example 39, wherein the additional bit values include a pair of least significant bits of the first codeword and a pair of most significant bits of the second codeword, wherein the first subset of the additional bit values includes a least significant bit of the first codeword, and wherein the second subset of the additional bit values includes a most significant bit of the second codeword are omitted from the encoded data.

Example 41 includes the non-transitory computer-readable storage medium of Example 39 or Example 40, wherein the encoded data further includes a flag bit located after the second set of bit values, and wherein the additional bit values are determined based further on the flag bit.

Example 42 includes the non-transitory computer-readable storage medium of Example 41, wherein determining the additional bit values includes accessing a predefined mapping to map the boundary bit, the flag bit, the at least some of the first set of bit values, and the at least some of the second set of bit values to the additional bit values, and wherein the predefined mapping is configured to map boundary bits, flag bits, and received bit values to encoded bits to prevent a cross-talk pattern in a sequence of codewords.

Example 43 includes the non-transitory computer-readable storage medium of Example 42, wherein the encoded data further includes a shield bit located between the second set of bit values and the flag bit, and wherein the first codeword and the second codeword are generated independently of the shield bit.

Example 44 includes the non-transitory computer-readable storage medium of Example 42 or Example 43, wherein the encoded data further includes a third set of bit values, a second boundary bit located between the second set of bit values and the third set of bit values, and a second flag bit located after the flag bit, and wherein the instructions further cause the at least one processor to: determine, at the receiver, second additional bit values based on the second boundary bit, the second flag bit, an additional subset of the second set of bit values, and at least some of the third set of bit values, wherein the second codeword is generated based further on a first subset of the second additional bit values; generate, at the receiver, a third codeword based on the third set of bit values and a second subset of the second additional bit values; and decode, at the receiver, the third codeword to further generate the representation of the input data.

According to Example 45, an apparatus includes: means for receiving encoded data via a communications link that includes a set of wires, wherein the encoded data includes at least a first set of bit values, a second set of bit values, and a boundary bit located between the first set of bit values and the second set of bit values; means for generating a first codeword based on the first set of bit values and a first subset of additional bit values, wherein the additional bit values are based on the boundary bit, at least some of the first set of bit values, and at least some of the second set of bit values; means for generating a second codeword based on the second set of bit values and a second subset of the additional bit values; and means for decoding at least the first codeword and the second codeword to generate a representation of input data associated with the encoded data.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, such implementation decisions are not to be interpreted as causing a departure from the scope of the present disclosure.

The steps of a method or algorithm described in connection with the implementations disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor may read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A system comprising:
   a communication link comprising a set of wires;
   an encoder coupled to the communication link, the encoder configured to:
      encode a first block of input data to form a first codeword;
      encode a second block of the input data to form a second codeword;
      generate a boundary bit based on at least one bit from each of the first codeword and the second codeword; and
      send encoded data via the communication link, the encoded data comprising a first set of bit values of the first codeword, a second set of bit values of the second codeword, and the boundary bit, wherein the boundary bit is located between the first set of bit values and the second set of bit values in the encoded data; and
   a decoder coupled to the communication link, the decoder configured to decode the encoded data to generate a representation of the input data.

2. The system of claim 1, wherein the encoder is configured to encode the first block and the second block based on an encoding scheme, wherein the decoder is configured to decode the encoded data based on a decoding scheme associated with the encoding scheme, and wherein the encoding scheme is configured to prevent a cross-talk pattern in encoded codewords.

3. The system of claim 2, wherein the cross-talk pattern includes two adjacent bits transitioning in opposite directions.

4. The system of claim 1, wherein the boundary bit is based on a pair of least significant bits of the first codeword and a pair of most significant bits of the second codeword, and wherein a least significant bit of the first codeword and a most significant bit of the second codeword are omitted from the encoded data.

5. The system of claim 1, wherein the encoder is further configured to:
   generate a flag bit based on the at least one bit from each of the first codeword and the second codeword,
   wherein the encoded data further comprises the flag bit, and wherein the flag bit is located after the second set of bit values in the encoded data.

6. The system of claim 5, wherein, to generate the boundary bit and the flag bit, the encoder is configured to:
   access a predefined mapping to map the at least one bit from each of the first codeword and the second codeword to the boundary bit and the flag bit, the predefined mapping configured to map encoded bits to boundary bits and flag bits to prevent a cross-talk pattern in a sequence of codewords.

7. The system of claim 5, wherein the encoded data further comprises a shield bit, and wherein the shield bit is located between the second set of bit values and the flag bit in the encoded data.

8. The system of claim 5, wherein the encoder is further comprised to:
   encode a third block of the input data to form a third codeword; and
   generate a second boundary bit based on at least one bit from each of the second codeword and the third codeword, wherein the encoded data further comprises a third set of bit values based on the third codeword and the second boundary bit, and wherein the second boundary bit is located between the second set of bit values and the third set of bit values in the encoded data.

9. The system of claim 8, wherein the encoder is further configured to:
   generate a second flag bit based on the at least one bit from each of the second codeword and the third codeword,
   wherein the encoded data further comprises the second flag bit, wherein the flag bit is located after the third set of bit values in the encoded data, and wherein the second flag bit is located after the flag bit in the encoded data.

10. The system of claim 9, wherein the encoded data comprises a plurality of flag bits that are located after the third set of bit values in the encoded data and that include the flag bit and the second flag bit, and wherein the encoder is configured to encode the plurality of flag bits based on a same encoding scheme associated with the first codeword, the second codeword, and the third codeword.

11. The system of claim 1, wherein, to decode the encoded data, the decoder is configured to:
   determine additional bit values based on the boundary bit, a flag bit included in the encoded data after the second set of bit values, a first subset of the first set of bit values, and a second subset of the second set of bit values;
   decode the first set of bit values and a first portion of the additional bit values to generate a representation of the first block of the input data; and
   decode the second set of bit values and a second portion of the additional bit values to generate a representation of the second block of the input data.

12. The system of claim 11, wherein the representation of the input data comprises a concatenation of the representation of the first block of the input data and the representation of the second block of the input data.

13. The system of claim 1, wherein the encoded data further comprises a third set of bit values of a third codeword, a second boundary bit, a flag bit, and a second flag bit, wherein the second boundary bit is located between the second set of bit values and the third set of bit values in the encoded data, wherein the flag bit is located after the third set of bit values in the encoded data, wherein the second flag bit is located after the flag bit in the encoded data, and wherein the decoder is further configured to:
   determine first additional bit values based on the boundary bit, the flag bit, a first subset of the first set of bit values, and a second subset of the second set of bit values;

determine second additional bit values based on the second boundary bit, the second flag bit, a third subset of the second set of bit values, and a fourth subset of the third set of bit values;

decode the first set of bit values and a first portion of the first additional bit values to generate a representation of the first block of the input data;

decode the second set of bit values, a second portion of the first additional bit values, and a fifth subset of the second additional bit values to generate a representation of the second block of the input data; and decode the third set of bit values and a sixth subset of the second additional bit values to generate a representation of a third block of the input data.

14. A method comprising:

encoding, at a transmitter of a device, a first block of input data to form a first codeword;

encoding, at the transmitter, a second block of the input data to form a second codeword;

generating, at the transmitter, a boundary bit based on at least one bit from each of the first codeword and the second codeword; and sending, from the transmitter, encoded data via a communication link that includes a set of wires, the encoded data comprising a first set of bit values of the first codeword, a second set of bit values of the second codeword, and the boundary bit, wherein the boundary bit is located between the first set of bit values and the second set of bit values in the encoded data.

15. The method of claim 14, further comprising generating, at the transmitter, a flag bit based on the at least one bit from each of the first codeword and the second codeword, wherein the encoded data further comprises the flag bit, and wherein the flag bit is located after the second set of bit values in the encoded data.

16. The method of claim 15, further comprising:

accessing, at the transmitter, a predefined mapping to map the at least one bit from each of the first codeword and the second codeword to the boundary bit and the flag bit;

inserting, at the transmitter, the boundary bit between the first set of bit values and the second set of bit values in the encoded data; and appending, at the transmitter, the flag bit to a set of bit values in the encoded data, the set of bit values associated with a last codeword that is encoded from the input data.

17. The method of claim 16, further comprising inserting, at the transmitter, a shield bit between the set of bit values associated with the last codeword and the flag bit, the shield bit having a particular value that is selected to prevent a cross-talk pattern in a plurality of flag bits that includes the flag bit.

18. The method of claim 16, further comprising:

encoding, at the transmitter, a third block of the input data to form a third codeword;

accessing, at the transmitter, the predefined mapping to map at least one bit from each of the second codeword and the third codeword to a second boundary bit and a second flag bit;

inserting, at the transmitter, the second boundary bit between the second set of bit values and a third set of bit values of the third codeword in the encoded data; and appending, at the transmitter, the second flag bit to the flag bit in the encoded data.

19. The method of claim 18, further comprising, at the transmitter and prior to adding the flag bit and the second flag bit to the encoded data, encoding a plurality of flag bits that includes at least the flag bit and the second flag bit.

20. A non-transitory computer-readable storage medium storing instructions that, when executed by at least one processor, cause the at least one processor to:

encode, at a transmitter of a device, a first block of input data to form a first codeword;

encode, at the transmitter, a second block of the input data to form a second codeword;

generate, at the transmitter, a boundary bit based on at least one bit from each of the first codeword and the second codeword; and send, from the transmitter, encoded data via a communication link that includes a set of wires, the encoded data comprising a first set of bit values of the first codeword, a second set of bit values of the second codeword, and the boundary bit, wherein the boundary bit is located between the first set of bit values and the second set of bit values in the encoded data.

21. The non-transitory computer-readable storage medium of claim 20, wherein the instructions further cause the at least one processor to generate, at the transmitter, a flag bit based on the at least one bit from each of the first codeword and the second codeword, wherein the encoded data further comprises the flag bit, and wherein the flag bit is located after the second set of bit values in the encoded data.

22. The non-transitory computer-readable storage medium of claim 21, wherein the instructions further cause the at least one processor to:

access, at the transmitter, a predefined mapping to map the at least one bit from each of the first codeword and the second codeword to the boundary bit and the flag bit;

insert, at the transmitter, the boundary bit between the first set of bit values and the second set of bit values in the encoded data; and append, at the transmitter, the flag bit to a set of bit values in the encoded data, the set of bit values associated with a last codeword that is encoded from the input data.

23. The non-transitory computer-readable storage medium of claim 22, wherein the instructions further cause the at least one processor to insert, at the transmitter, a shield bit between the set of bit values associated with the last codeword and the flag bit, the shield bit having a particular value that is selected to prevent a cross-talk pattern in a plurality of flag bits that includes the flag bit.

24. The non-transitory computer-readable storage medium of claim 22, wherein the instructions further cause the at least one processor to:

encode, at the transmitter, a third block of the input data to form a third codeword;

access, at the transmitter, the predefined mapping to map at least one bit from each of the second codeword and the third codeword to a second boundary bit and a second flag bit;

insert, at the transmitter, the second boundary bit between the second set of bit values and a third set of bit values of the third codeword in the encoded data; and append, at the transmitter, the second flag bit to the flag bit in the encoded data.

25. The non-transitory computer-readable storage medium of claim 24, wherein the instructions further cause the at least one processor to encode, at the transmitter and prior to adding the flag bit and the second flag bit to the encoded data, a plurality of flag bits that includes at least the flag bit and the second flag bit.

\* \* \* \* \*